US009224834B1

(12) United States Patent
Masuoka et al.

(10) Patent No.: US 9,224,834 B1
(45) Date of Patent: Dec. 29, 2015

(54) METHOD FOR MANUFACTURING PILLAR-SHAPED SEMICONDUCTOR DEVICE

(71) Applicant: UNISANTIS ELECTRONICS SINGAPORE PTE. LTD., Singapore (SG)

(72) Inventors: Fujio Masuoka, Tokyo (JP); Nozomu Harada, Tokyo (JP)

(73) Assignee: Unisantis Electronics Singapore Pte. Ltd., Singapore (SG)

(*) Notice: Subject to any disclaimer, the term of this patent is extended or adjusted under 35 U.S.C. 154(b) by 0 days.

(21) Appl. No.: 14/680,420

(22) Filed: Apr. 7, 2015

Related U.S. Application Data

(63) Continuation of application No. PCT/JP2013/084759, filed on Dec. 25, 2013.

(51) Int. Cl.
| | | |
|---|---|---|
| H01L 21/336 | (2006.01) | |
| H01L 21/302 | (2006.01) | |
| H01L 29/66 | (2006.01) | |
| H01L 29/423 | (2006.01) | |
| H01L 21/324 | (2006.01) | |
| H01L 29/08 | (2006.01) | |

(Continued)

(52) U.S. Cl.
CPC ........ *H01L 29/66666* (2013.01); *H01L 21/225* (2013.01); *H01L 21/28512* (2013.01); *H01L 21/324* (2013.01); *H01L 29/0847* (2013.01); *H01L 29/42376* (2013.01)

(58) Field of Classification Search
USPC .......................................... 438/268, 689–692
See application file for complete search history.

(56) References Cited

U.S. PATENT DOCUMENTS

| 5,311,050 A | 5/1994 | Nitayama et al. |
|---|---|---|
| 8,212,298 B2 | 7/2012 | Masuoka et al. |

(Continued)

FOREIGN PATENT DOCUMENTS

| JP | 2188966 A | 7/1990 |
|---|---|---|
| JP | 4-207069 A | 7/1992 |
| WO | 2009096468 A1 | 8/2009 |

OTHER PUBLICATIONS

Takato, H., et al., "Impact of surrounding gate transistor (SGT) for ultra-high-density LSI's", IEEE Transactions on Electron Devices, Mar. 3, 1991, pp. 573-578, vol. 38, No. 3.

(Continued)

*Primary Examiner* — Marc Armand
*Assistant Examiner* — Wilner Jean Baptiste
(74) *Attorney, Agent, or Firm* — Laurence Greenberg; Werner Stemer; Ralph Locher

(57) ABSTRACT

An $N^+$ region $2a$ and a $P^+$ region $3a$ are formed in a Si pillar 6. $HfO_2$ layers $9a$ and $9c$, TiN layers $10b$ and $10d$, and $SiO_2$ layers $11b$ and $11d$ are formed to surround the Si pillar 6. Then contact portions $21a$ and $21b$ are respectively formed in side surfaces of the $N^+$ region $2a$ and the $P^+$ region $3a$ and a side surface of the TiN layer $10d$. Then Si and Ni atoms are injected in a direction perpendicular to an upper surface of an i-layer substrate 1 from above the Si pillar 6 to form a Si layer and a Ni layer. Subsequently, a heat treatment is performed to expand NiSi layers $18a$ and 22 in a horizontal direction by Ni-silicidation. As a result, the NiSi layers $18a$ and 22 connect to the $N^+$ region $2a$ and the $P^+$ region $3a$ or the TiN layer $10d$.

9 Claims, 30 Drawing Sheets

(51) Int. Cl.
*H01L 21/225* (2006.01)
*H01L 21/285* (2006.01)

(56) References Cited

U.S. PATENT DOCUMENTS 8,476,699 B2 * 7/2013 Masuoka ........ H01L 21/823487
257/290
2004/0256665 A1 * 12/2004 Birner ............... H01L 27/10841
257/329

OTHER PUBLICATIONS

Shibata, T., et al., "A new field isolation technology for high density MOS LSI", Japanese Journal of Applied Physics, Proceedings of the 10th Conference on Solid State Devices, 1979, pp. 263-267, vol. 18.

Ting, C.Y., et al., "Study of planarized sputter-deposited SiO2", Journal of Vacuum Science & Technology, pp. 1105-1112, May/Jun. 1978.

* cited by examiner

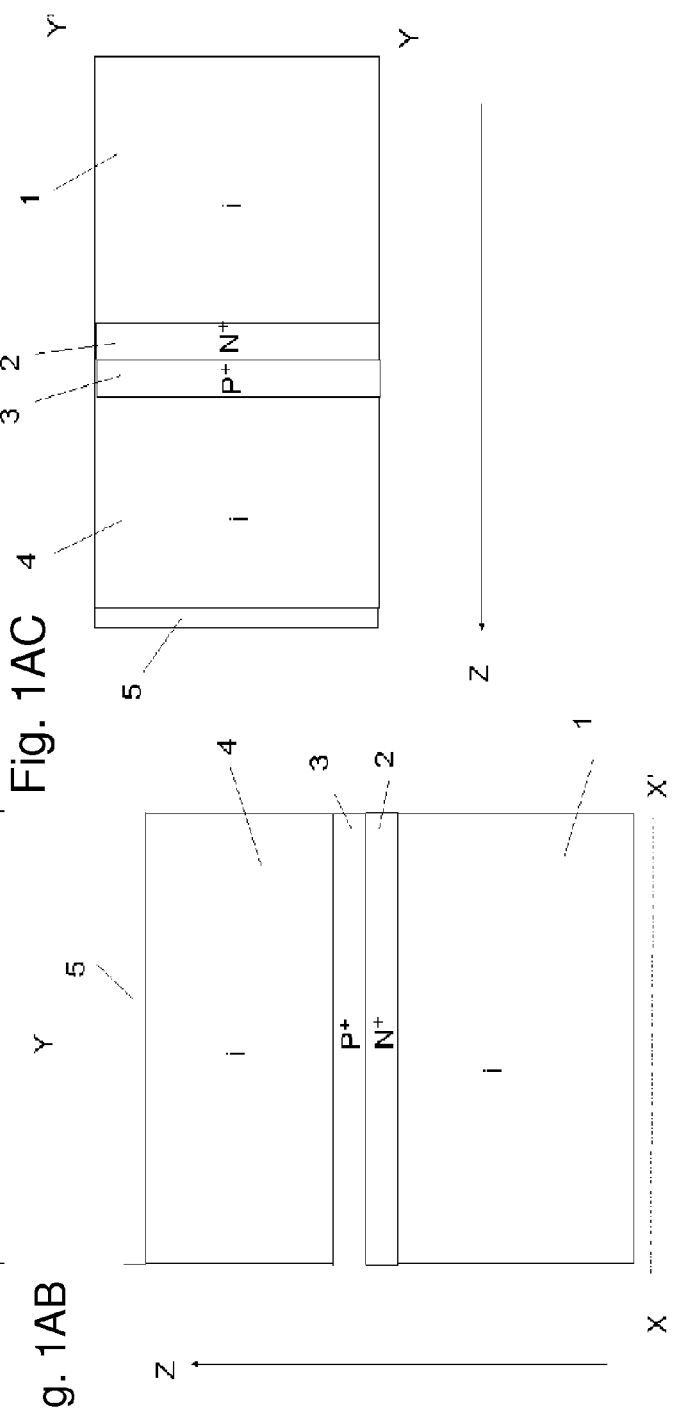
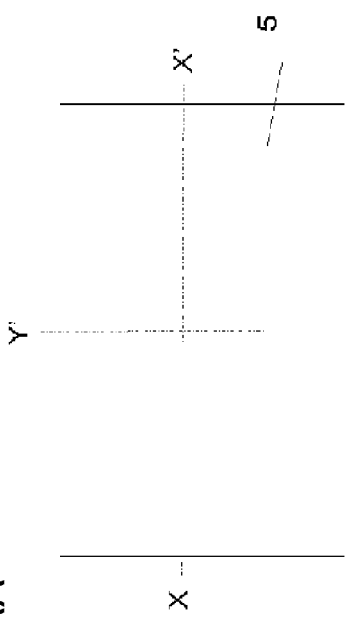
Fig. 1AA
Fig. 1AB
Fig. 1AC

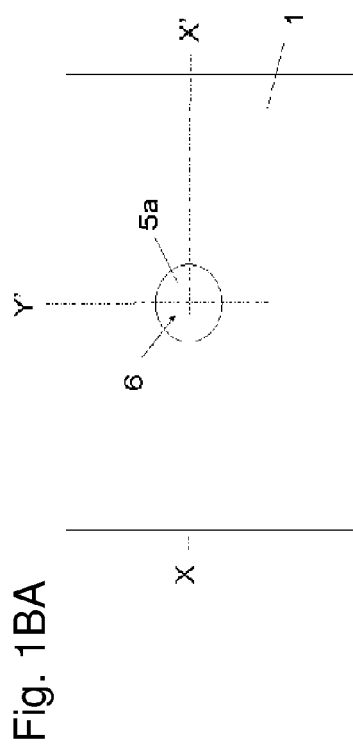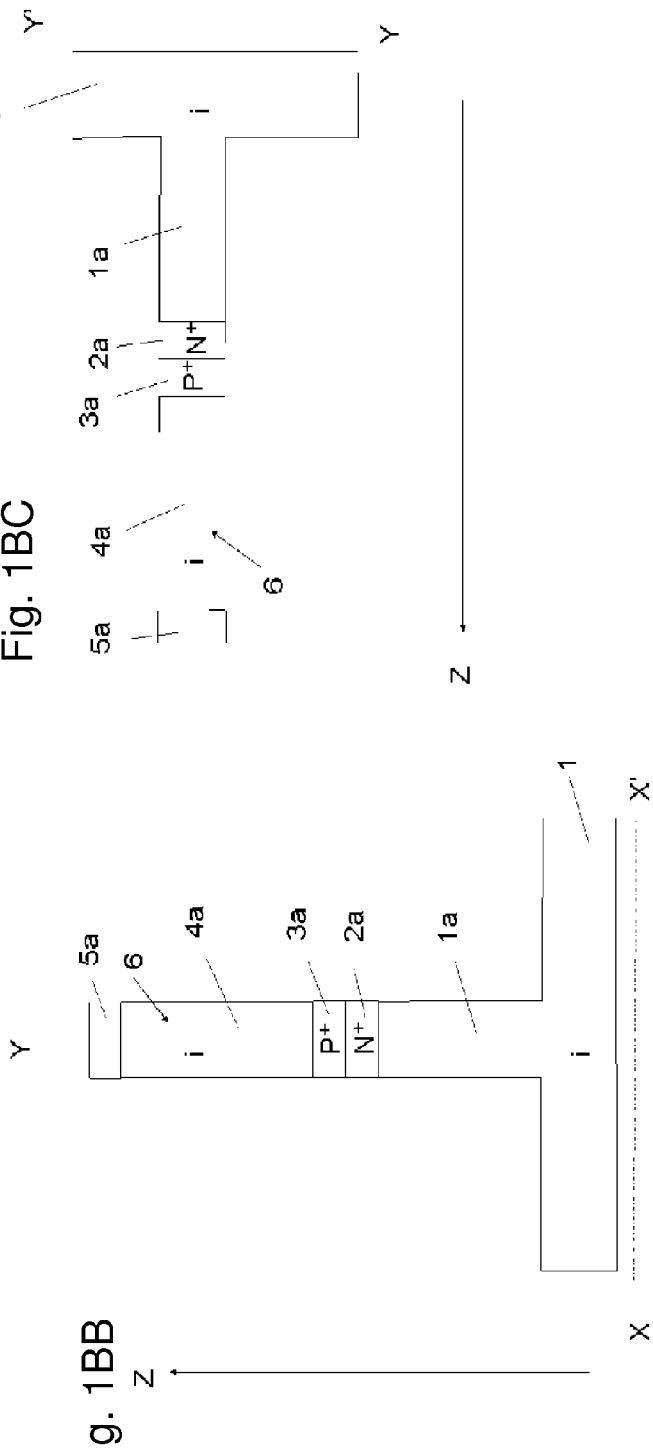
Fig. 1BA
Fig. 1BB
Fig. 1BC

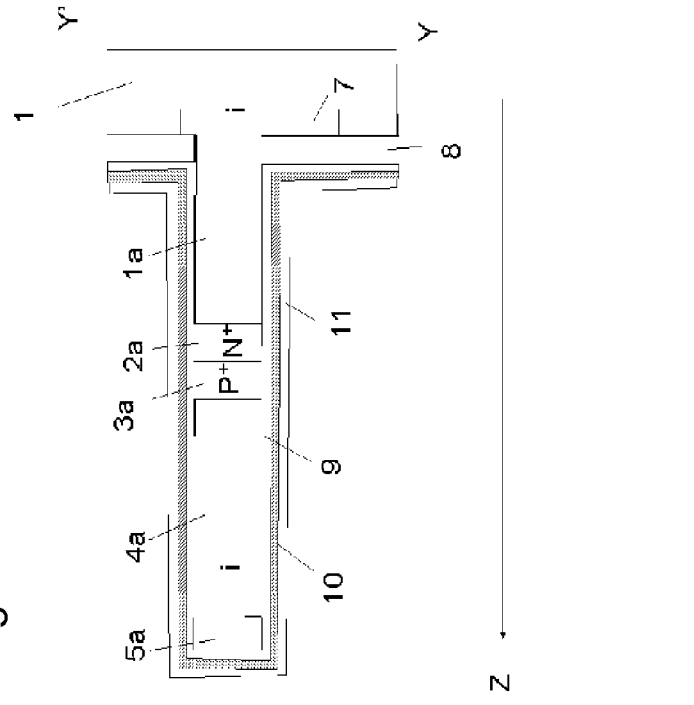
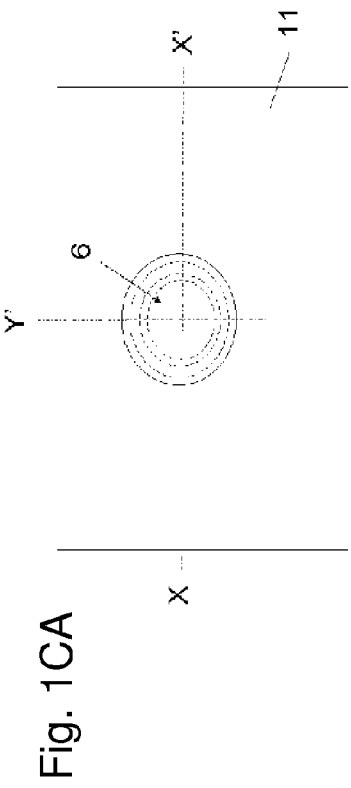
Fig. 1CA
Fig. 1CB
Fig. 1CC

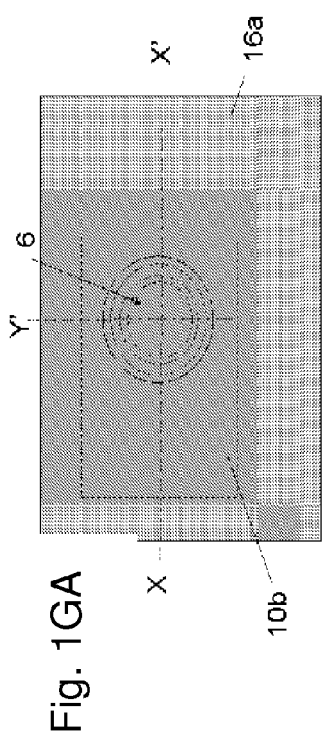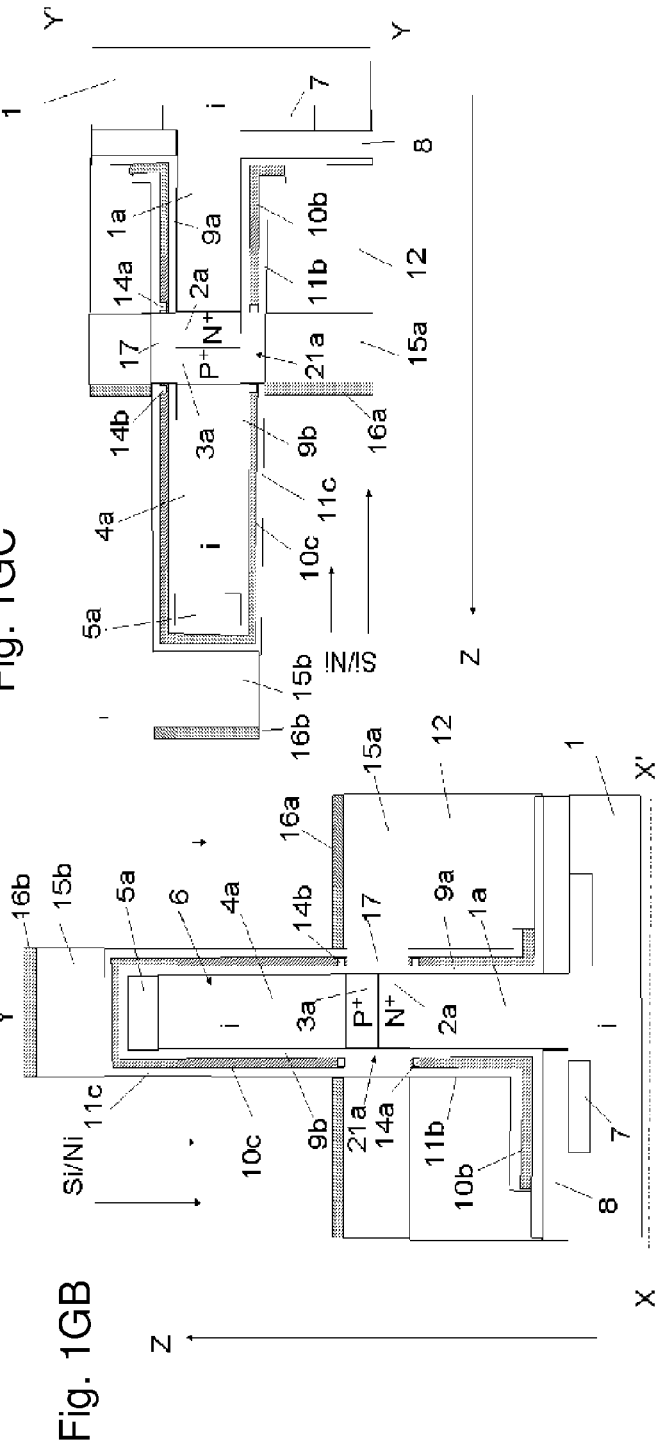
Fig. 1GA
Fig. 1GB
Fig. 1GC

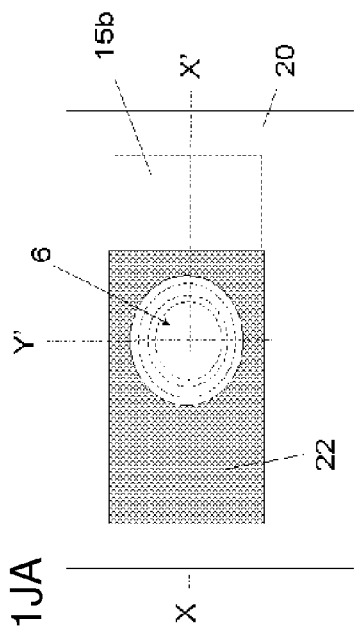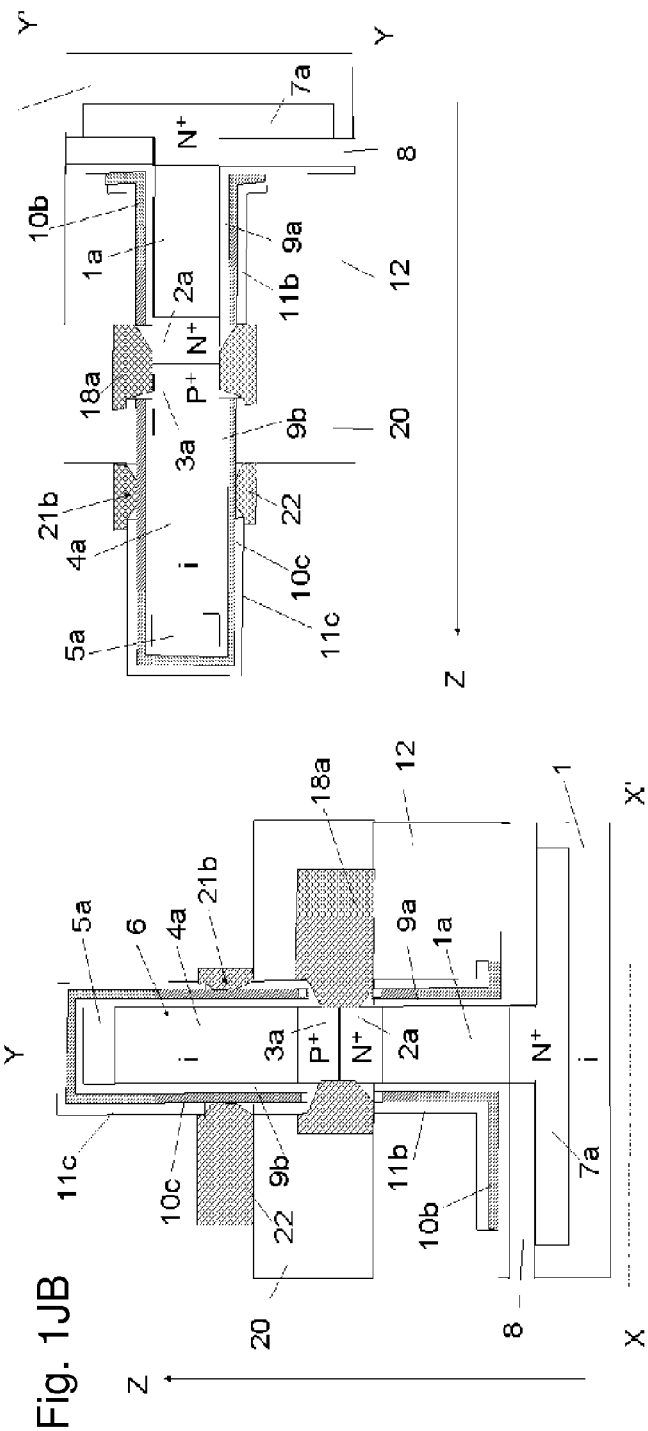
Fig. 1JA
Fig. 1JB
Fig. 1JC

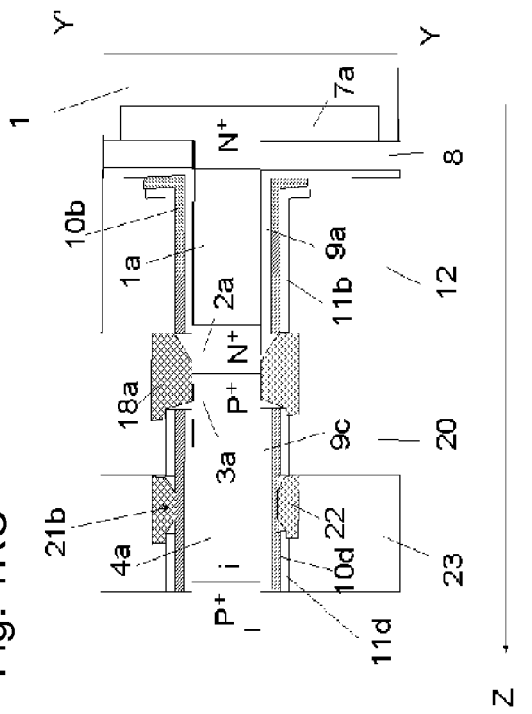
Fig. 1KA
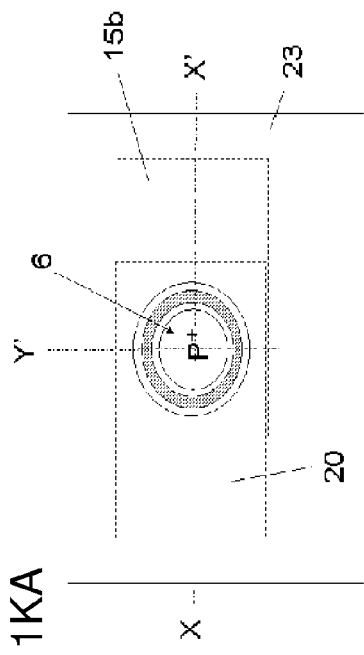
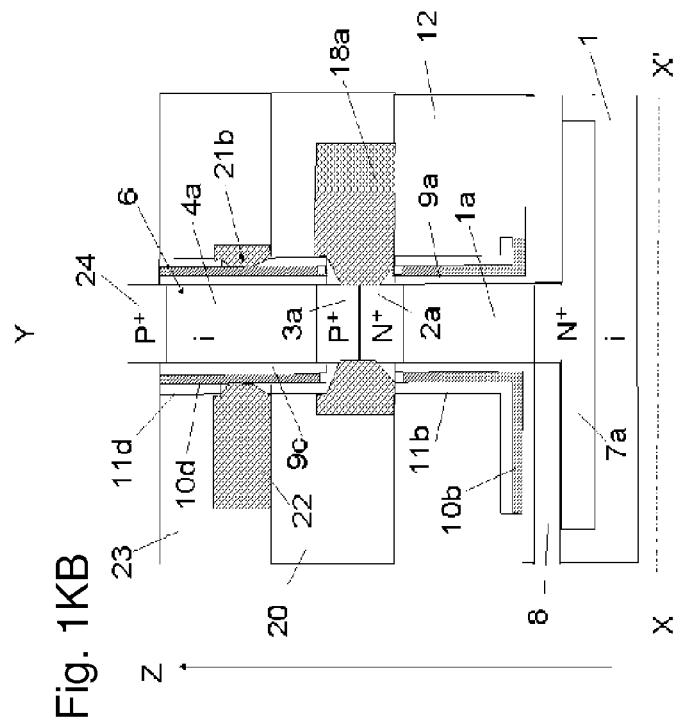
Fig. 1KB
Fig. 1KC

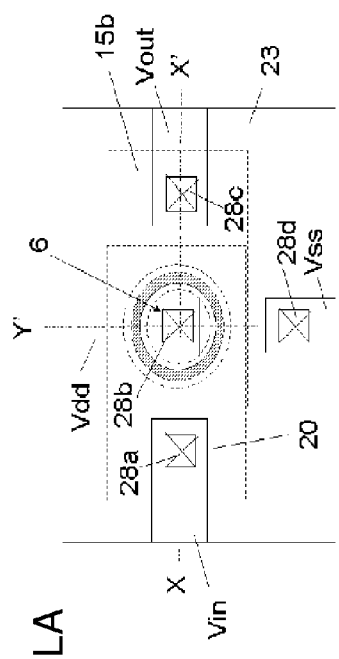
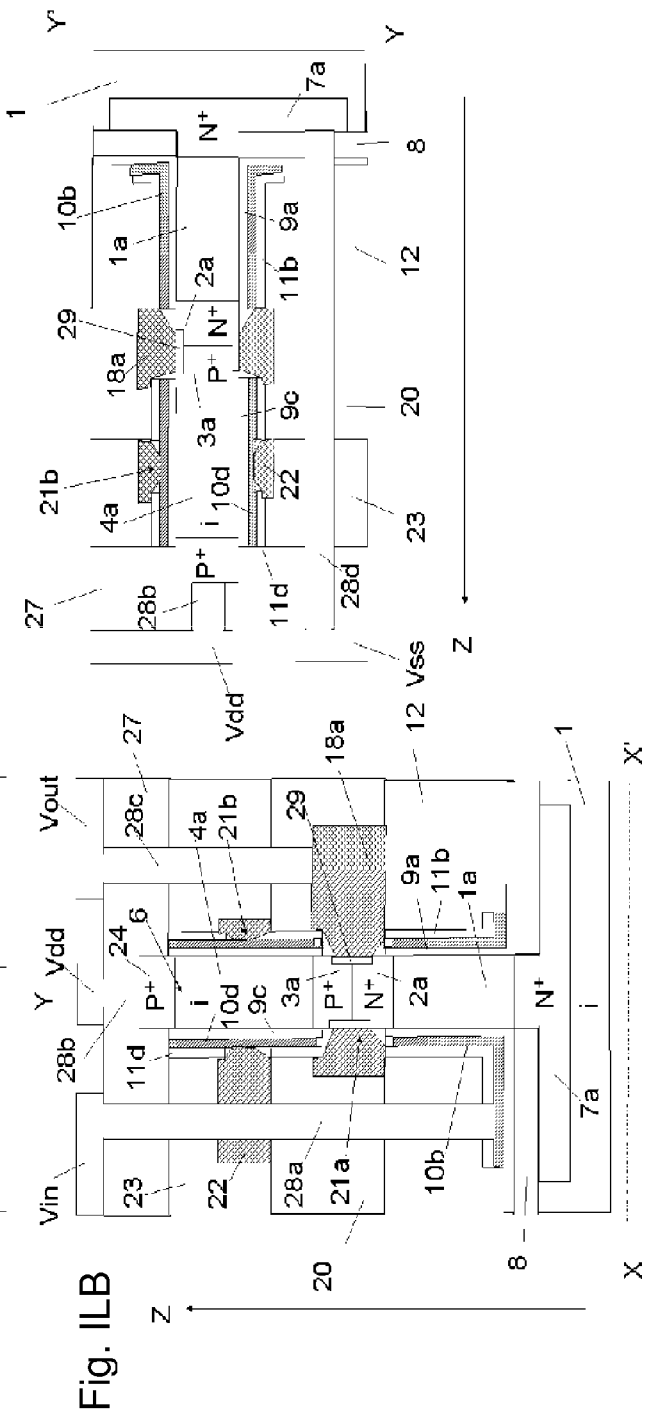
Fig. 1LA
Fig. 1LB
Fig. 1LC

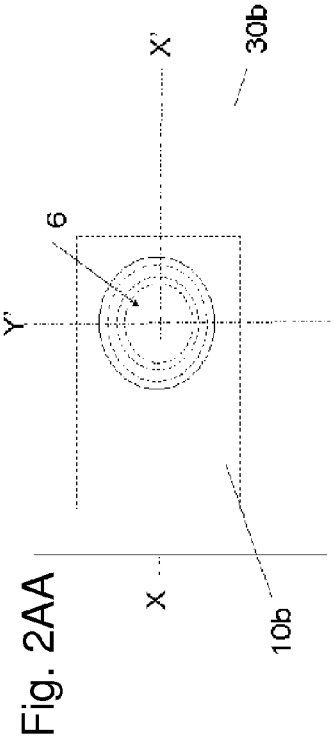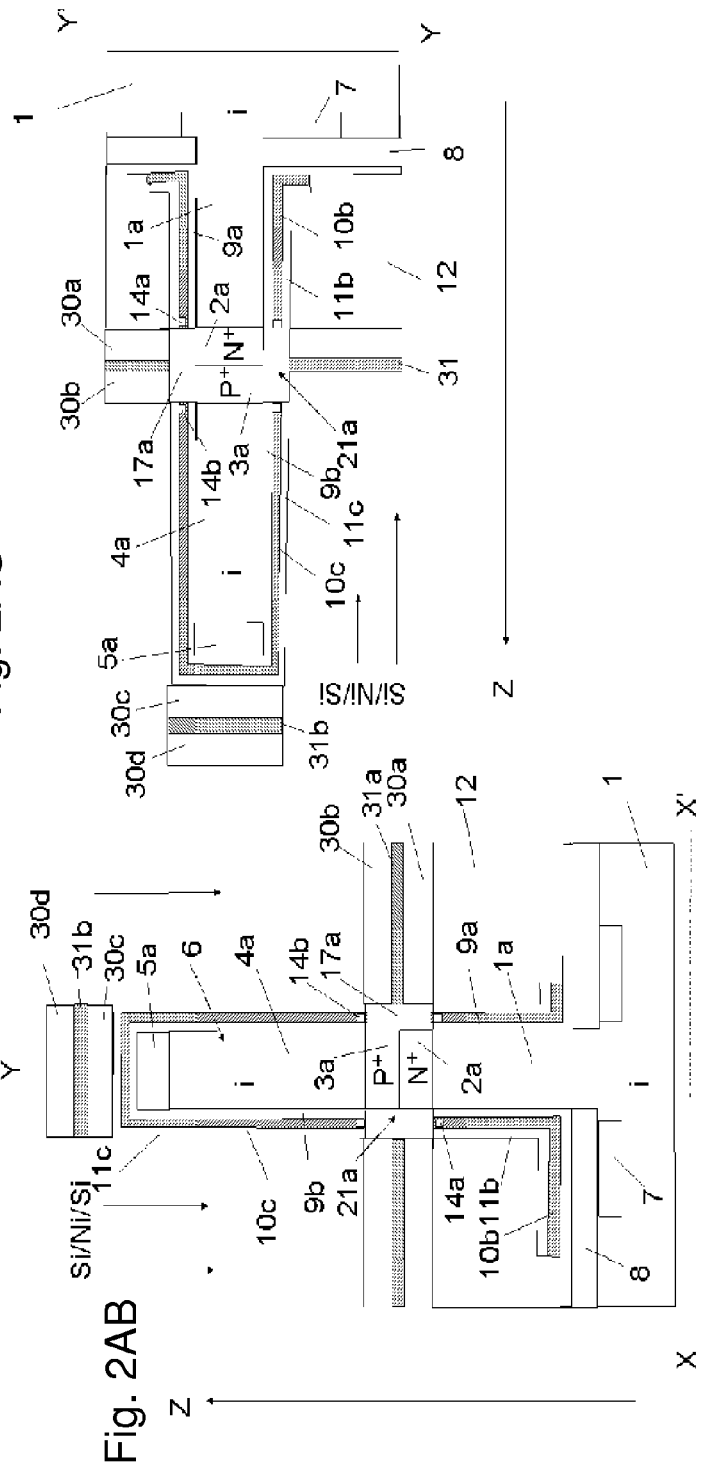

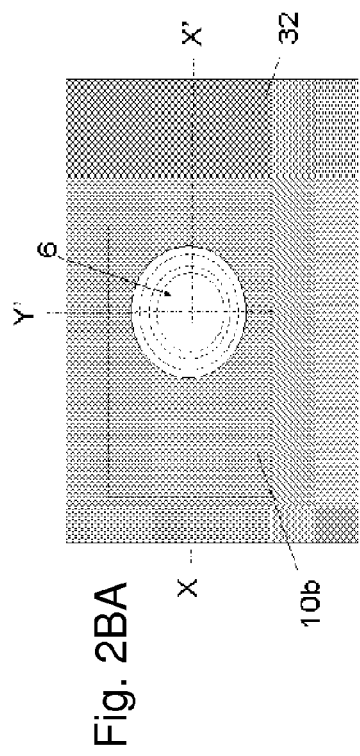
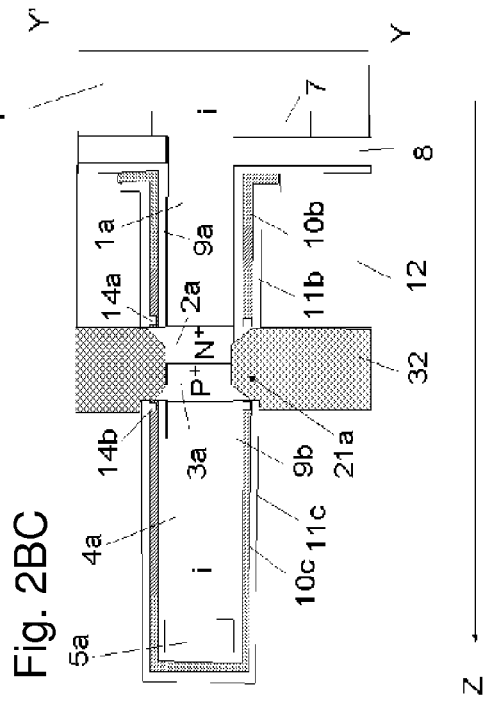
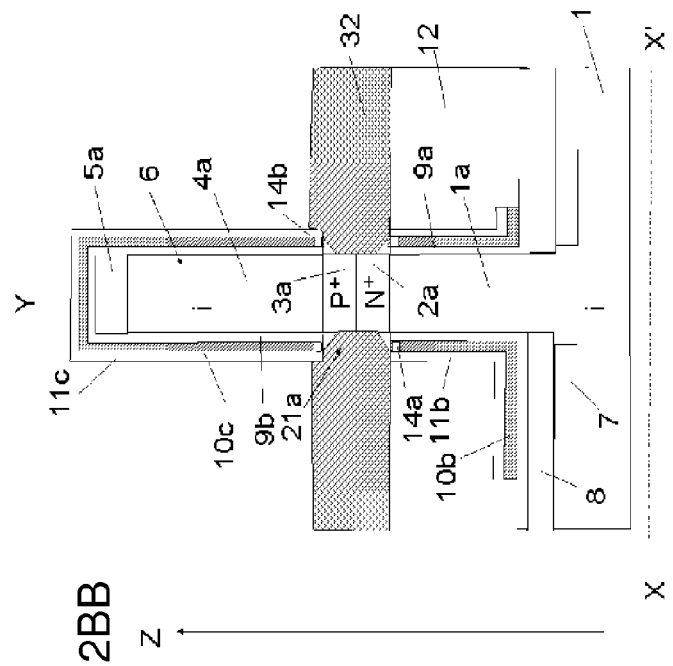
Fig. 2BA
Fig. 2BB
Fig. 2BC

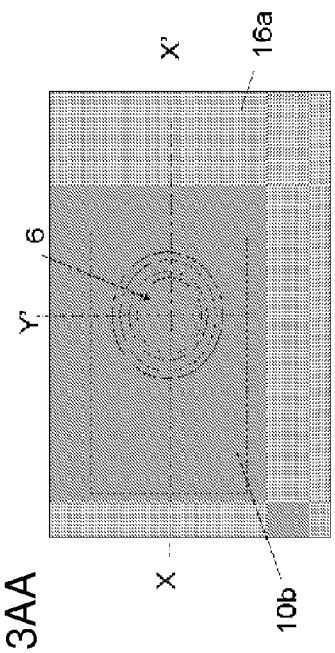
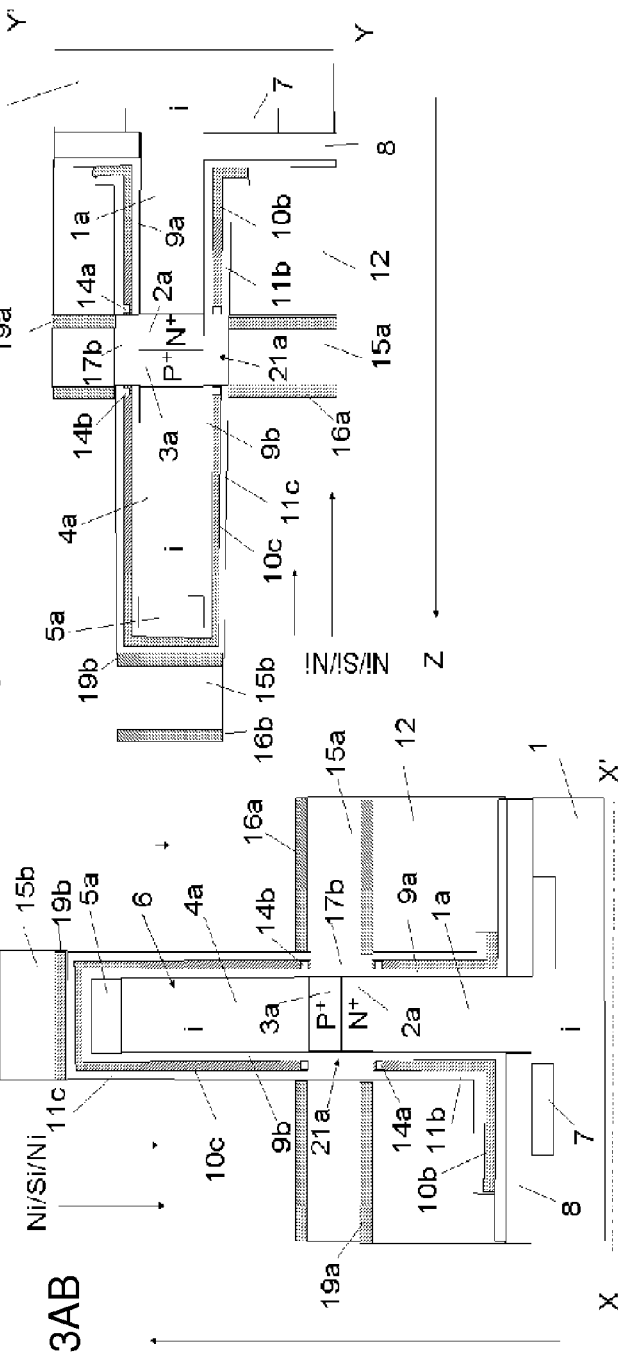
Fig. 3AA
Fig. 3AB
Fig. 3AC

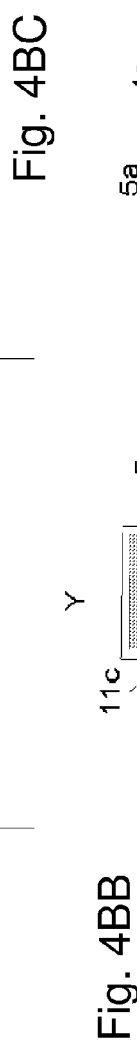
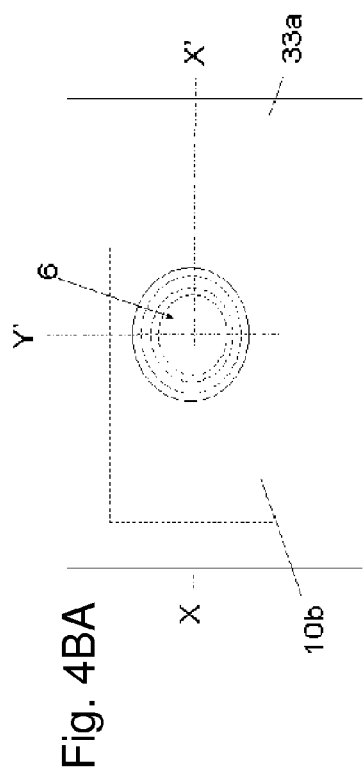
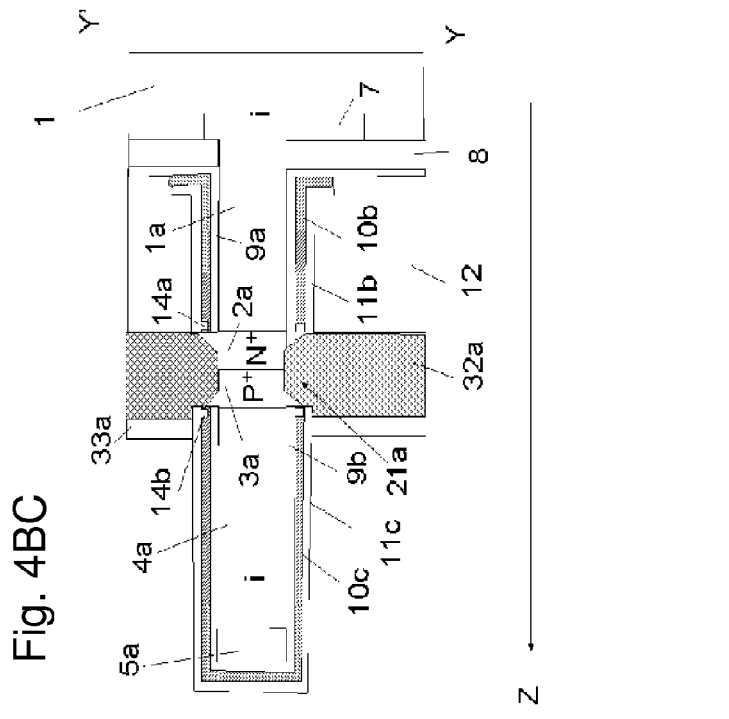
Fig. 4BA
Fig. 4BB
Fig. 4BC

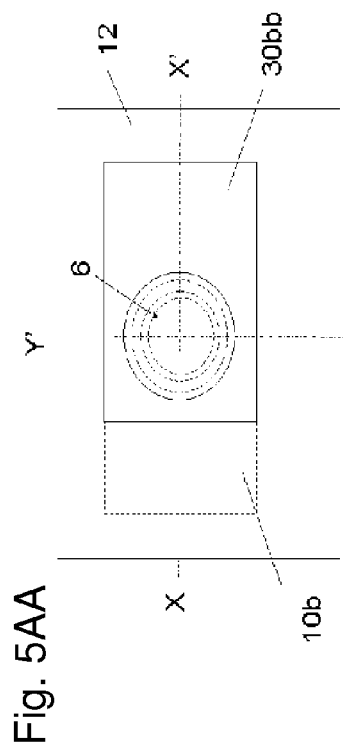
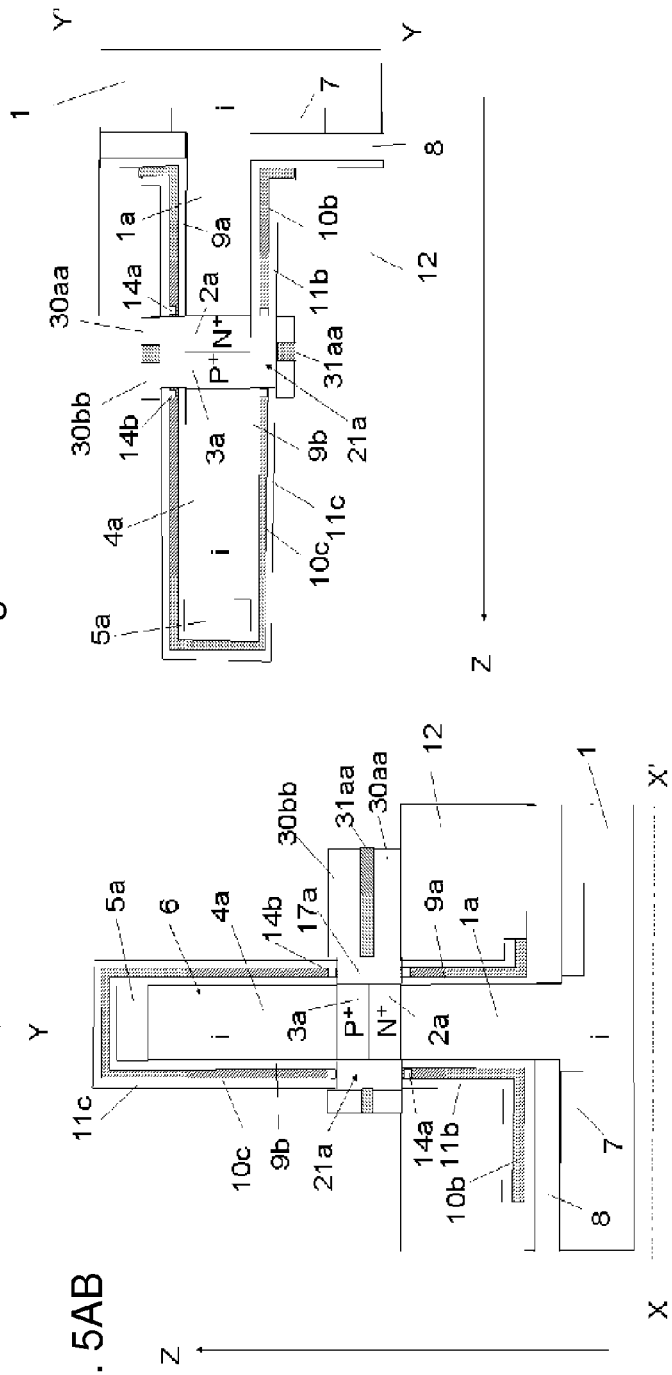

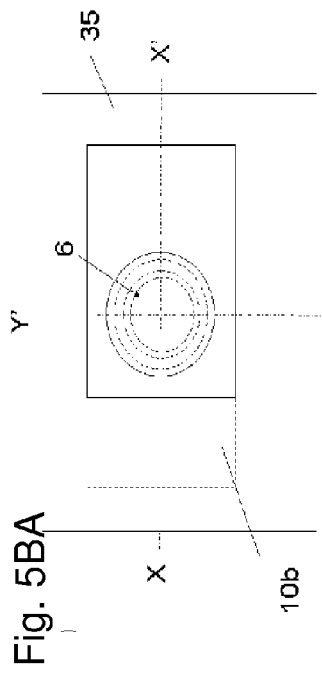
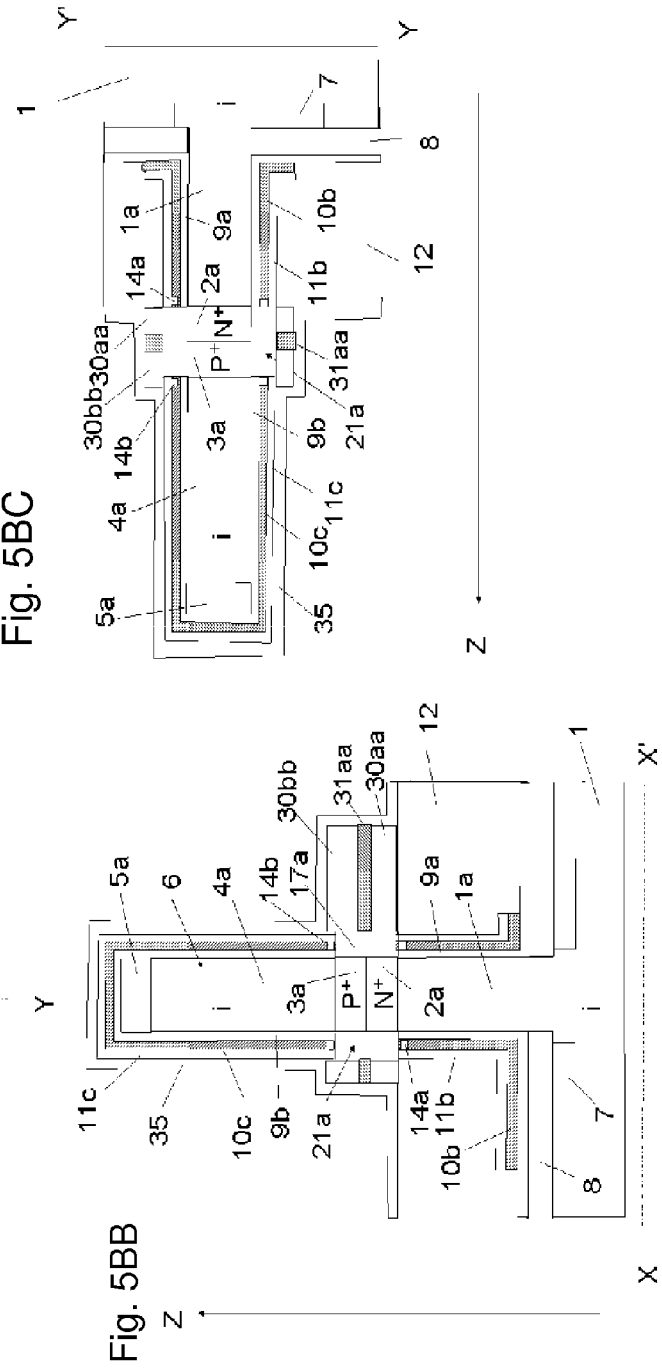

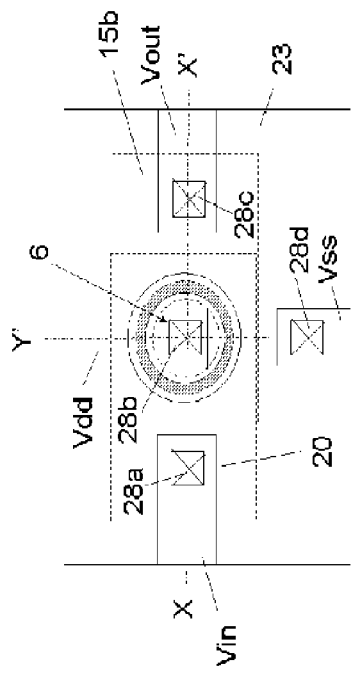
Fig. 7AA
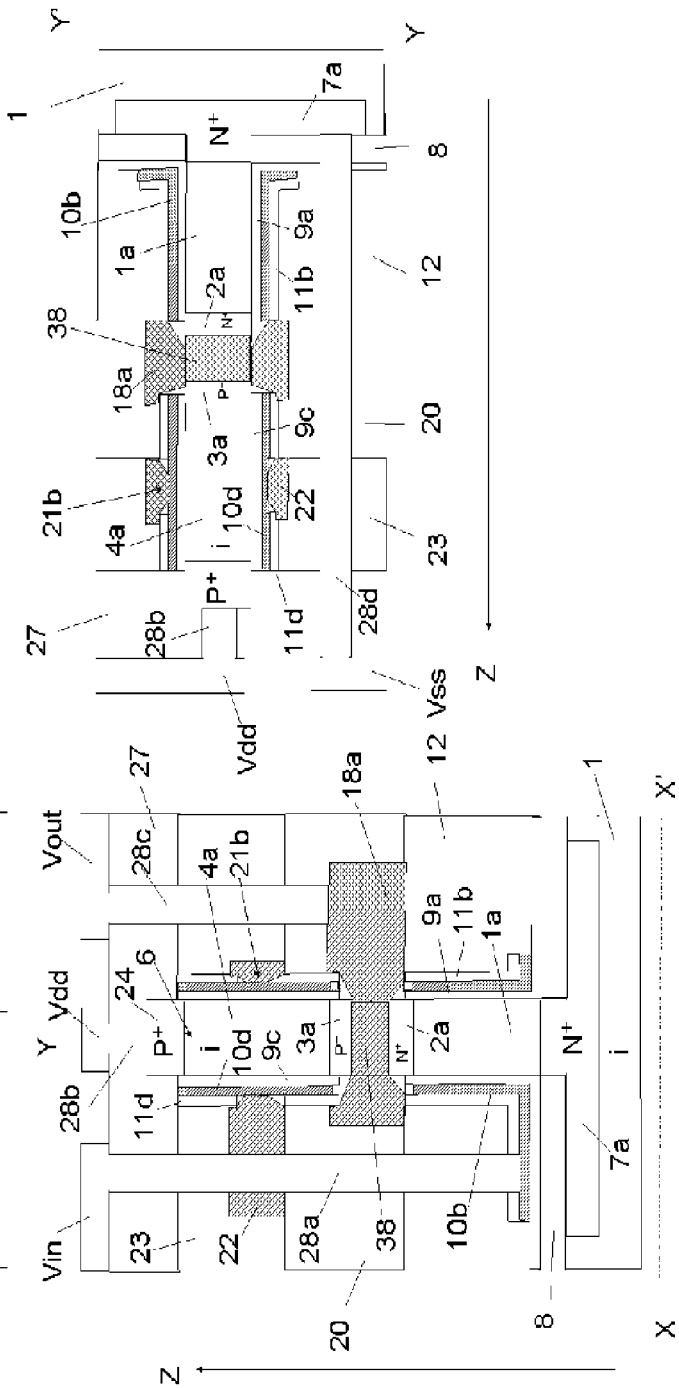
Fig. 7AC
Fig. 7AB

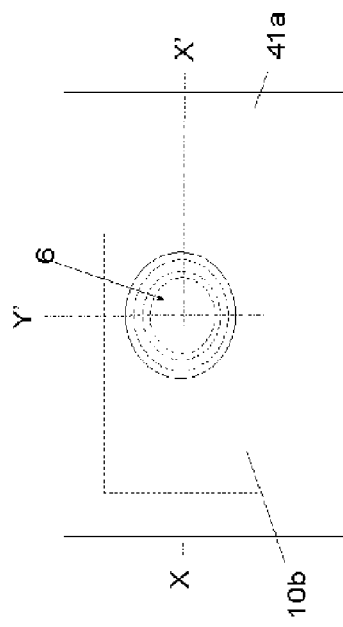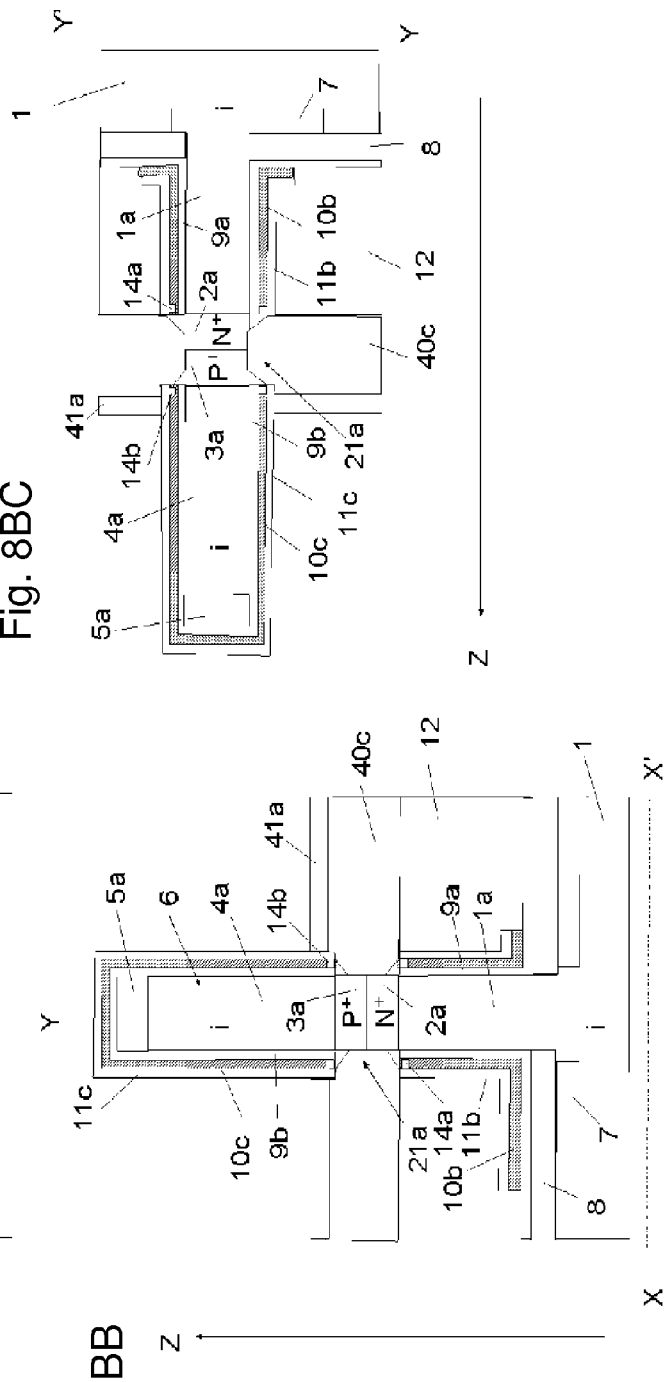
Fig. 8BA
Fig. 8BB
Fig. 8BC

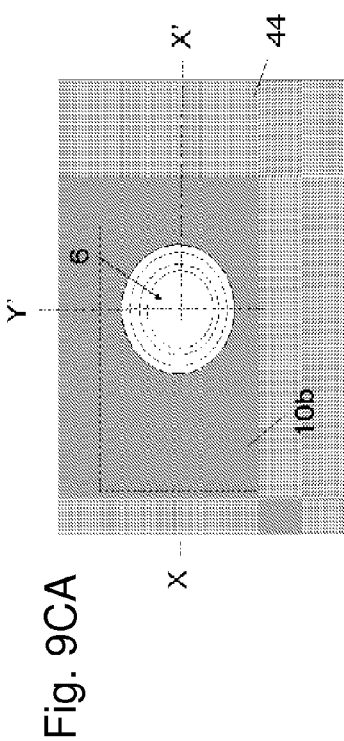
Fig. 9CA
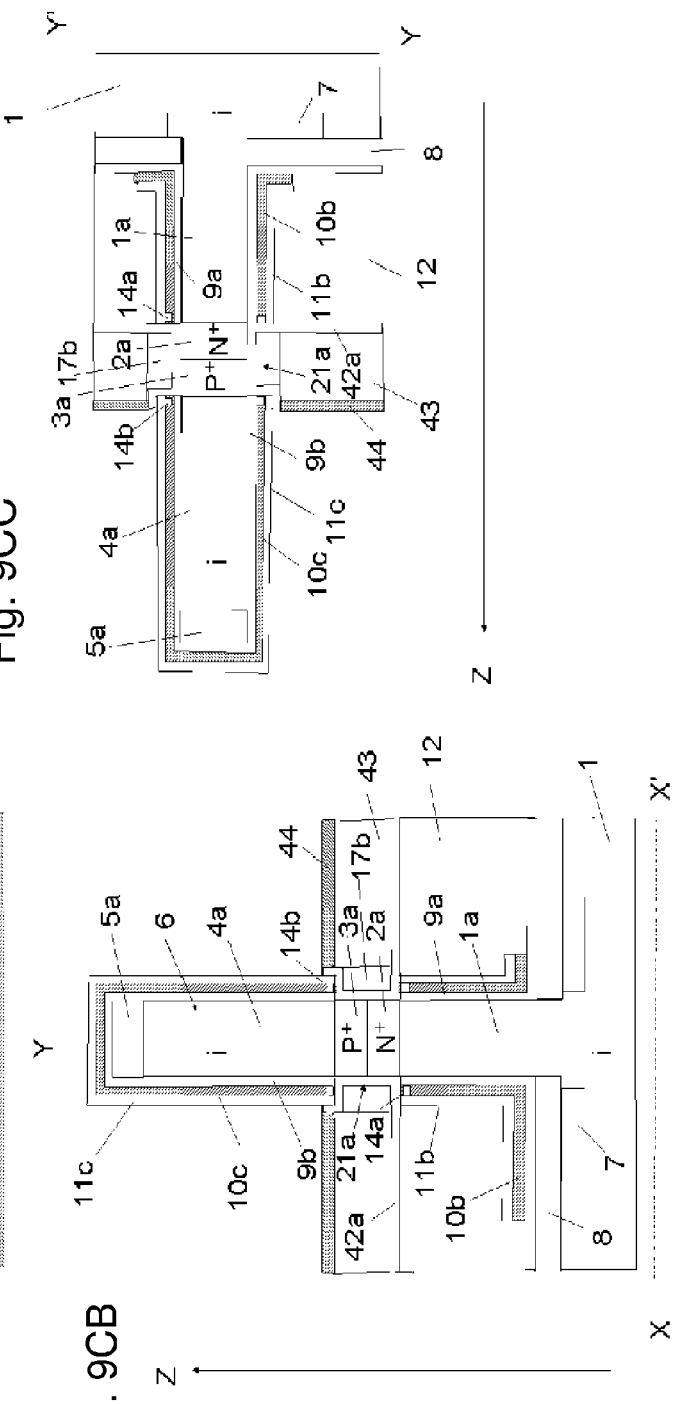
Fig. 9CB
Fig. 9CC

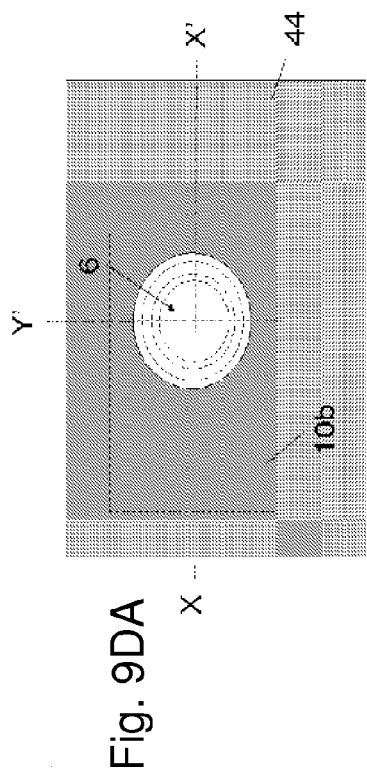
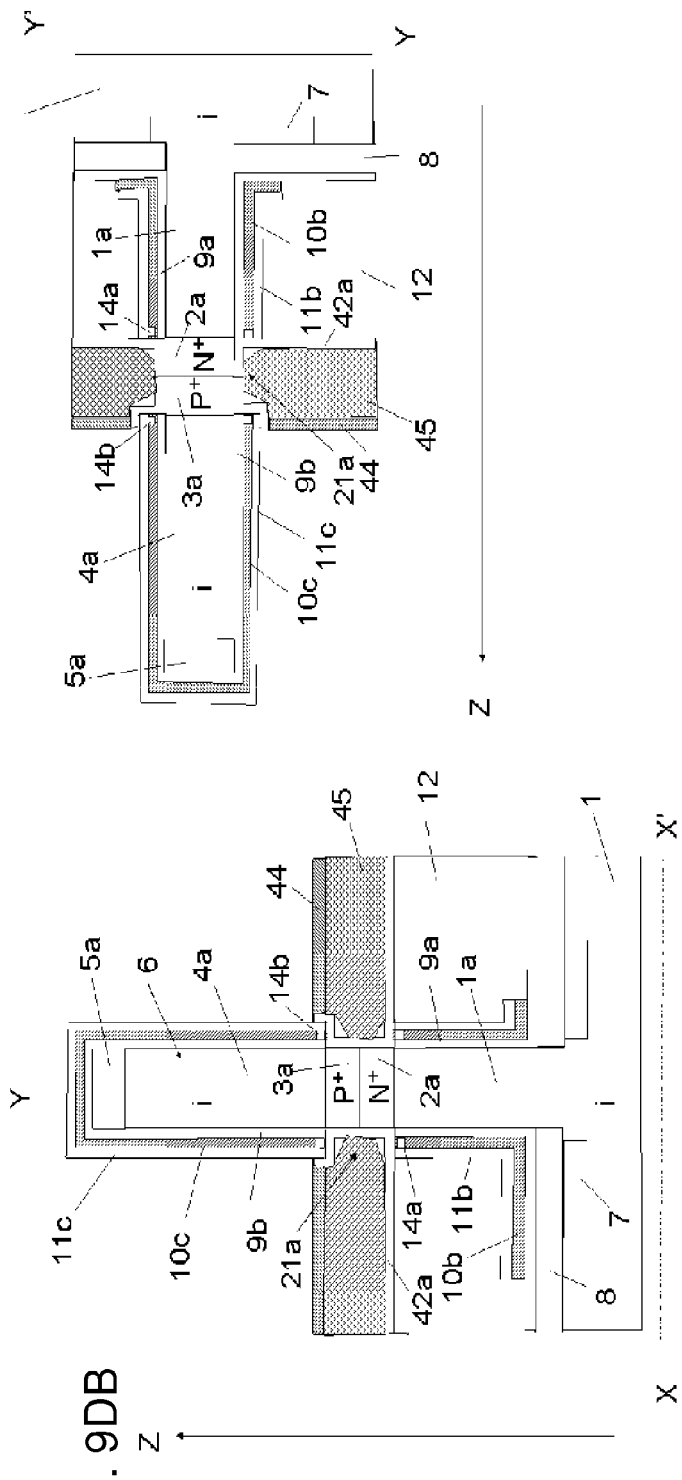
Fig. 9DA
Fig. 9DB
Fig. 9DC

METHOD FOR MANUFACTURING PILLAR-SHAPED SEMICONDUCTOR DEVICE

CROSS-REFERENCE TO RELATED APPLICATION

This application is a continuation, under 35 U.S.C. §120, of copending international application No. PCT/JP2013/084759, filed Dec. 25, 2013, which designated the United States; the prior application is herewith incorporated by reference in its entirety.

BACKGROUND OF THE INVENTION

Field of the Invention

The present invention relates to a method for manufacturing a pillar-shaped semiconductor device.

In recent years, surrounding gate MOS transistors (SGTs) which are a representative example of pillar-shaped semiconductor devices have gathered much attention as semiconductor elements that can be used to form highly integrated semiconductor devices. A further increase in the degree of integration of SGT-including semiconductor devices is highly anticipated.

A typical planar MOS transistor has a channel extending in a horizontal direction along an upper surface of a semiconductor substrate. In contrast, the channel of an SGT extends in a direction perpendicular to an upper surface of a semiconductor substrate (for example, refer to PTL 1 and NPL 1). Thus, compared to planar MOS transistors, SGTs help increase the density of semiconductor devices.

FIG. 10 is a schematic diagram of an N-channel SGT. An $N^+$ region 101a and an $N^+$ region 101b (hereinafter a semiconductor region having a high donor impurity concentration is referred to as an "$N^+$ region") are respectively formed in an upper portion and a lower portion of a Si pillar 100 having a P-type or i(intrinsic)-type conductivity (hereinafter a silicon semiconductor pillar is referred to as "Si pillar"). When the $N^+$ region 101a serves as a source, the $N^+$ region 101b serves as a drain and when the $N^+$ region 101a serves as a drain, the $N^+$ region 101b serves as a source. The Si pillar 100 that lies between the $N^+$ region 101a and $N^+$ region 101b serving as a source and a drain is a channel region 102. A gate insulating layer 103 is formed so as to surround the channel region 102 and a gate conductor layer 104 is formed so as to surround the gate insulating layer 103. In the SGT, the $N^+$ regions 101a and 101b serving as a source and a drain, the channel region 102, the gate insulating layer 103, and the gate conductor layer 104 are formed within a single Si pillar 100. Accordingly, the area of the SGT in plan view corresponds to the area of a single source or drain $N^+$ region of a planar MOS transistor. Thus, a circuit chip that includes SGTs is smaller than a circuit chip that includes planar MOS transistors.

Attempts are now being made to further decrease the size of SGT-including circuit chips. For example, it has been anticipated that the circuit area can be reduced by forming two SGTs 116a and 116b in the upper portion and the lower portion of one Si pillar 115 as illustrated in a schematic diagram of FIG. 11.

FIG. 11 is a schematic diagram of a CMOS inverter circuit in which an N channel SGT 116a is formed in a lower portion of the Si pillar 115 and a P channel SGT 116b is formed above the N channel SGT 116a. The Si pillar 115 is formed on a P layer substrate 117 (hereinafter, a semiconductor layer containing an acceptor impurity is referred to as a "P layer"). A $SiO_2$ layer 118 is formed at the outer periphery of the Si pillar 115 and on the P layer substrate 117. A gate insulating layer 119a of the N channel SGT 116a and a gate insulating layer 119b of the P channel SGT 116b are formed so as to surround the Si pillar 115. A gate conductor layer 120a of the N channel SGT 116a and a gate conductor layer 120b of the P channel SGT 116b are formed at the outer periphery of the Si pillar 115 so as to surround the gate insulating layers 119a and 119b. An $N^+$ region 121a is formed in a surface layer portion of the P layer substrate 117 connected to the bottom portion of the Si pillar 115, an $N^+$ region 121b is formed at the center of the Si pillar 115, a $P^+$ region 122a (hereinafter a semiconductor region having a high acceptor impurity concentration is referred to as a "$P^+$ region") is formed within the Si pillar 115 connected to the $N^+$ region 121b, and a $P^+$ region 122b is formed in a top portion of the Si pillar 115. The $N^+$ region 121a is a source of the N channel SGT 116a and the $N^+$ region 121b is a drain of the N channel SGT 116a. The Si pillar 115 that lies between the $N^+$ regions 121a and 121b is a channel region 123a of the N channel SGT 116a. The $P^+$ region 122b is a source of the P channel SGT 116b and the $P^+$ region 122a is a drain of the P channel SGT 116b. The Si pillar 115 that lies between the $P^+$ regions 122a and 122b is a channel region 123b of the P channel SGT 116b. A nickel silicide layer (NiSi layer) 125a is formed in the surface layer portion of the $N^+$ region 121a connected to the bottom portion of the Si pillar 115, a NiSi layer 125b is formed at the outer peripheries of the $N^+$ region 121b and the $P^+$ region 122a located in the center portion of the Si pillar 115, and a NiSi layer 125c is formed in an upper surface layer of the $P^+$ region 122b in the top portion of the Si pillar 115. A ground wiring metal layer 126a is formed so as to connect to the NiSi layer 125a in the $N^+$ region 121a. The ground wiring metal layer 126a is connected to a ground terminal VSS. Similarly, an output wiring metal layer 126b is formed so as to connect to the NiSi layer 125b. The output wiring metal layer 126b is connected to an output terminal Vo. Similarly, a power supply wiring metal layer 126c is formed so as to connect to the NiSi layer 125c. The power supply wiring metal layer 126c is connected to a power supply terminal VDD. Input wiring metal layers 127a and 127b are formed so as to connect to the gate conductor layers 120a and 120b. The input wiring metal layers 127a and 127b are each connected to an input terminal Vi.

In FIG. 11, the NiSi layer 125b connected to the $N^+$ region 121b and the $P^+$ region 122a located in the center portion of the Si pillar 115 is formed by coating outer peripheral surfaces of the $N^+$ region 121b and the $P^+$ region 122a with a nickel (Ni) film, performing a heat treatment at about 450° C., for example, and removing the Ni film remaining on the surfaces. As a result, the NiSi layer 125b is formed so as to extend from the outer peripheries of the $N^+$ region 121b and the $P^+$ region 122a toward the interior. For example, when the Si pillar 115 has a diameter of 20 nm, the NiSi layer 125b is preferably formed to have a thickness of about 5 nm to 10 nm. When the NiSi layer 125b has a thickness of 10 nm, the NiSi layer 125b occupies the entire cross section of the Si pillar 115. The linear thermal expansion coefficient of NiSi is $12 \times 10^{-6}$/K, which is five times the linear thermal expansion coefficient of Si which is $2.4 \times 10^{-6}$/K. Thus, large stress-induced strain is generated inside the Si pillar 115 due to the NiSi layer 125b. As a result, failures such as bending or collapsing of the Si pillar 115 may readily occur. More failures would occur when the diameter of the Si pillar is decreased in order to increase the degree of circuit integration. Under such circumstances, a technique of securely establishing the connection between the $N^+$ region 121b and the output wiring metal layer 126b and between the $P^+$ region 122a and the output wiring metal layer 126b has been a challenge. Moreover, since the side surface of the Si pillar 115 is processed, the technique of securely establishing the connection between the gate conductor layer 120a and the input wiring metal layer 127a and between the gate conductor layer 120b and the input wiring metal layer 127b has also been a challenge.

The following list includes patent and non-patent literature regarding the background of this invention:

PTL 1: Japanese Unexamined Patent Application Publication No. 2-188966

NPL 1: Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)

NPL 2: Tadashi Shibata, Susumu Kohyama and Hisakazu Iizuka: "A New Field Isolation Technology for High Density MOS LSI", Japanese Journal of Applied Physics, Vol. 18, pp. 263-267 (1979)

NPL 3: C. Y. Ting, V. J. Vivalda, and H. G. Schaefer: "Study of planarized sputter-deposited $SiO_2$. J. Vac. Sci. Technol, 15(3), May/June (1978)

SUMMARY OF INVENTION

As discussed above, an SGT-including pillar-shaped semiconductor device illustrated in FIG. 11 requires a technique of securely and easily forming the output wiring metal layer 126b at the side surface of the Si pillar 115 and the $N^+$ region 121b and the $P^+$ region 122a at the center portion of the Si pillar 115 without causing bending or collapsing of the Si pillar 115. Furthermore, a technique of securely and easily forming a connection between the gate conductor layer 120a and the input wiring metal layer 127a and the gate conductor layer 120b and the input wiring metal layer 127b at the side surface of the Si pillar 115 is also required.

An aspect of the present invention provides a method for manufacturing a pillar-shaped semiconductor device, the method comprising:

a semiconductor pillar forming step of forming a semiconductor pillar on a semiconductor substrate;

a first impurity region forming step of forming a first impurity region in the semiconductor pillar, the first impurity region containing a donor and/or acceptor impurity and including at least one impurity layer;

a first insulating layer forming step of forming a first insulating layer so as to surround an outer periphery of the semiconductor pillar;

a conductive layer forming step of forming a conductive layer so as to surround an outer periphery of the first insulating layer;

a second insulating layer forming step of forming a second insulating layer so as to surround an outer periphery of the conductive layer;

an interlayer insulating layer forming step including at least one selected from a third insulating layer forming step of forming a third insulating layer having an upper surface positioned near a lower end of the first impurity region and a fourth insulating layer forming step of forming a fourth insulating layer having an upper surface positioned at a side surface of the conductive layer in a middle position in a height direction;

a side surface contact portion forming step including at least one selected from an impurity region side surface contact portion forming step of forming an impurity region side surface contact portion by etching-away the first insulating layer, the conductive layer, and the second insulating layer in a portion positioned at an outer periphery of a side surface of the first impurity region above the upper surface of the third insulating layer and a conductive layer side surface contact portion forming step of forming a conductive layer side surface contact portion by etching-away the second insulating layer in a portion positioned at the outer periphery of the conductive layer above the upper surface of the fourth insulating layer;

a material layer depositing step including at least one selected from a step of forming a first material layer on the third insulating layer so that the impurity region side surface contact portion forms a space and an upper surface of the first material layer is positioned near an upper end portion of the impurity region side surface contact portion and a step of forming a second material layer on the fourth insulating layer so that the conductive layer side surface contact portion forms a space and an upper surface of the second material layer is positioned to be higher than an upper end of the conductive layer side surface contact portion, these steps being performed by injecting an atom group in a direction perpendicular to an upper surface of the semiconductor substrate from above the semiconductor pillar, the atom group containing atoms constituting at least a conductive material; and a heat treatment step of performing a heat treatment to change a shape of the first material layer or the second material layer, wherein the heat treatment step includes a material layer connecting step that includes at least one selected from a step of expanding the first material layer so as to connect to the side surface of the first impurity region and a step of expanding the second material layer so as to connect to the side surface of the conductive layer.

Preferably, the method further comprises a second impurity region forming step of forming a second impurity region in a lower portion and/or an upper portion of the semiconductor pillar, the second impurity region having the same conductivity type as each impurity layer constituting the first impurity region, wherein a surrounding gate MOS transistor (SGT) is formed in which when one of the first impurity region and the second impurity region serves as a source, the other serves as a drain, the first insulating layer serves as a gate insulating layer, and the first conductive layer serves as a gate conductor layer.

a. Preferably, the method further comprises a fifth insulating layer forming step of forming, after forming at least one selected from the first material layer and the second material layer, a fifth insulating layer on the first material layer and the second material layer, wherein the heat treatment step is performed after the fifth insulating layer forming step.

Preferably, at least one selected from the first material layer and the second material layers is composed of a semiconductor material, the method further comprises a first metal material layer forming step of forming a metal-containing first metal material layer so as to contact at least one selected from an upper surface and a lower surface of the first material or the second material layer composed of the semiconductor material, and in the heat treatment step, the heat treatment is performed to diffuse metal atoms from the first metal material layer into at least one selected from the first material layer and the second material layer so as to form a first alloy layer and the material layer connecting step is performed by expanding the first alloy layer.

Preferably, the method further comprises a second metal material layer forming step of forming a second metal material layer by causing at least one selected from the first material layer and the second material layer to contain a metal, wherein, in the heat treatment step, the heat treatment is performed so as to plastically deform and expand the second metal material layer to carry out the material layer connecting step.

Preferably, in the material layer connecting step of connecting the first alloy layer to the side surface of the first impurity region by expanding the first alloy layer, a second alloy layer having the same composition as the first alloy layer is formed in a side surface layer of the first impurity region.

Preferably, in the material layer connecting step of connecting the first alloy layer to the side surface of the first impurity region by expanding the first alloy layer, a third alloy layer having the same composition as the first alloy layer is formed so as to penetrate the first impurity region in a horizontal direction.

Preferably, in the material layer connecting step, a fourth alloy layer containing metal atoms contained in the second metal material layer is formed in a part of the first impurity region.

Preferably, the method further comprises a semiconductor material layer forming step of forming a semiconductor material layer so as to surround the outer periphery of the first impurity region at the impurity region side surface contact portion, wherein in the heat treatment step, the heat treatment is performed so as to connect the first material layer to a side surface of the semiconductor material layer by expanding the first material layer.

ADVANTAGEOUS EFFECTS OF INVENTION

According to the present invention, in an SGT-including semiconductor device, it becomes possible to suppress bending and collapsing of a semiconductor pillar that occur when an alloy layer is formed in a metal wiring layer electrically connected to a semiconductor region or a gate conductor layer present in a central portion of the semiconductor pillar. Furthermore, The connection between the semiconductor region or gate conductor layer and the wiring metal layer connected to the alloy layer can be securely established.

Other features which are considered as characteristic for the invention are set forth in the appended claims.

Although the invention is illustrated and described herein as embodied in a Method For Manufacturing Pillar-Shaped Semiconductor Device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 1AA is a plan view, FIG. 1AB and FIG. 1AC are cross-sectional views of a CMOS inverter circuit for explaining a method for manufacturing an SGT-including semiconductor device according to a first embodiment of the present invention.

FIG. 1BA is a plan view, FIG. 1BB and FIG. 1BC are cross-sectional views of the CMOS inverter circuit for explaining the method for manufacturing an SGT-including semiconductor device according to the first embodiment.

FIG. 1CA is a plan view, FIG. 1CB and FIG. 1CC are cross-sectional views of the CMOS inverter circuit for explaining the method for manufacturing an SGT-including semiconductor device according to the first embodiment.

FIG. 1GA is a plan view, FIG. 1GB and FIG. 1GC are cross-sectional views of the CMOS inverter circuit for explaining the method for manufacturing an SGT-including semiconductor device according to the first embodiment.

FIG. 1JA is a plan view, FIG. 1JB and FIG. 1JC are cross-sectional views of the CMOS inverter circuit for explaining the method for manufacturing an SGT-including semiconductor device according to the first embodiment.

FIG. 1KA is a plan view, FIG. 1KB and FIG. 1KC are cross-sectional views of the CMOS inverter circuit for explaining the method for manufacturing an SGT-including semiconductor device according to the first embodiment.

FIG. 1LA is a plan view, FIG. 1LB and FIG. 1LC are cross-sectional views of the CMOS inverter circuit for explaining the method for manufacturing an SGT-including semiconductor device according to the first embodiment.

FIG. 2AA is a plan view, FIG. 2AB and FIG. 2AC are cross-sectional views of a CMOS inverter circuit for explaining a method for manufacturing an SGT-including semiconductor device according to a second embodiment of the present invention.

FIG. 2BA is a plan view, FIG. 2BB and FIG. 2BC are cross-sectional views of the CMOS inverter circuit for explaining the method for manufacturing an SGT-including semiconductor device according to the second embodiment.

FIG. 3AA is a plan view, FIG. 3AB and FIG. 3AC are cross-sectional views of a CMOS inverter circuit for explaining a method for manufacturing an SGT-including semiconductor device according to a third embodiment of the present invention.

FIG. 4BA is a plan view, FIG. 4BB and FIG. 4BC are cross-sectional views of the CMOS inverter circuit for explaining the method for manufacturing an SGT-including semiconductor device according to the fourth embodiment.

FIG. 5AA is a plan view, FIG. 5AB and FIG. 5AC are cross-sectional views of a CMOS inverter circuit for explaining a method for manufacturing an SGT-including semiconductor device according to a fifth embodiment of the present invention.

FIG. 5BA is a plan view, FIG. 5BB and FIG. 5BC are cross-sectional views of the CMOS inverter circuit for explaining the method for manufacturing an SGT-including semiconductor device according to the fifth embodiment.

FIG. 7AA is a plan view, FIG. 7AB and FIG. 7AC are cross-sectional views of a CMOS inverter circuit for explaining a method for manufacturing an SGT-including semiconductor device according to a sixth embodiment of the present invention.

FIG. 8BA is a plan view, FIG. 8BB and FIG. 8BC are cross-sectional views of the CMOS inverter circuit for explaining the method for manufacturing an SGT-including semiconductor device according to the eighth embodiment.

FIG. 9CA is a plan view, FIG. 9CB and FIG. 9CC are cross-sectional views of the CMOS inverter circuit for explaining the method for manufacturing an SGT-including semiconductor device according to the ninth embodiment.

FIG. 9DA is a plan view, FIG. 9DB and FIG. 9DC are cross-sectional views of the CMOS inverter circuit for explaining the method for manufacturing an SGT-including semiconductor device according to the ninth embodiment.

DETAILED DESCRIPTION OF THE INVENTION

Figure 1D:
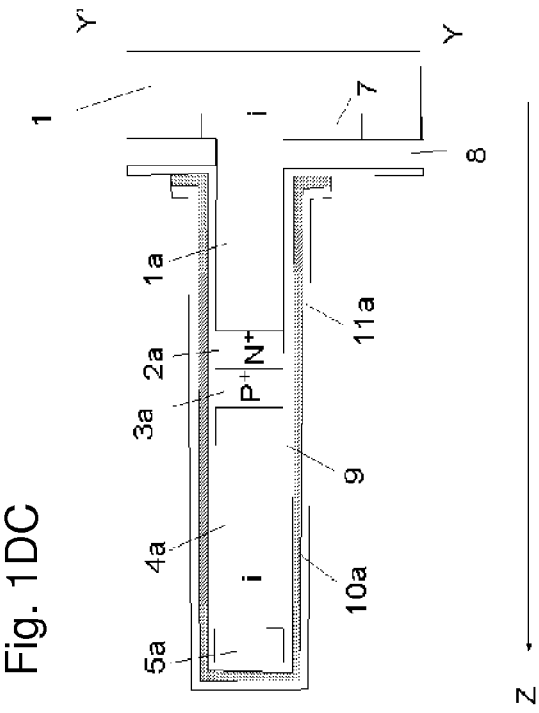
FIG. 1DA is a plan view, FIG. 1DB and FIG. 1DC are cross-sectional views of the CMOS inverter circuit for explaining the method for manufacturing an SGT-including semiconductor device according to the first embodiment.
Figure 1D:
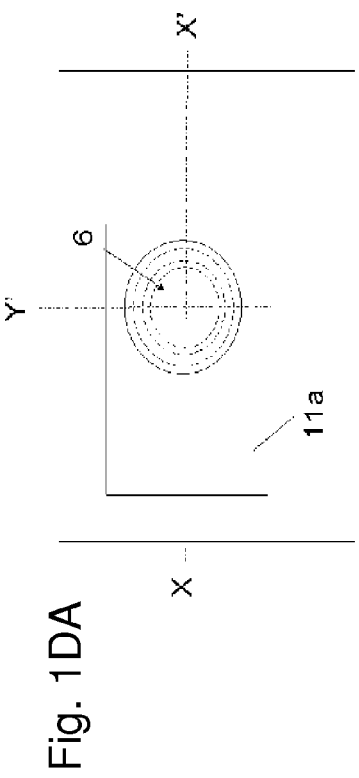
Figure 1D:
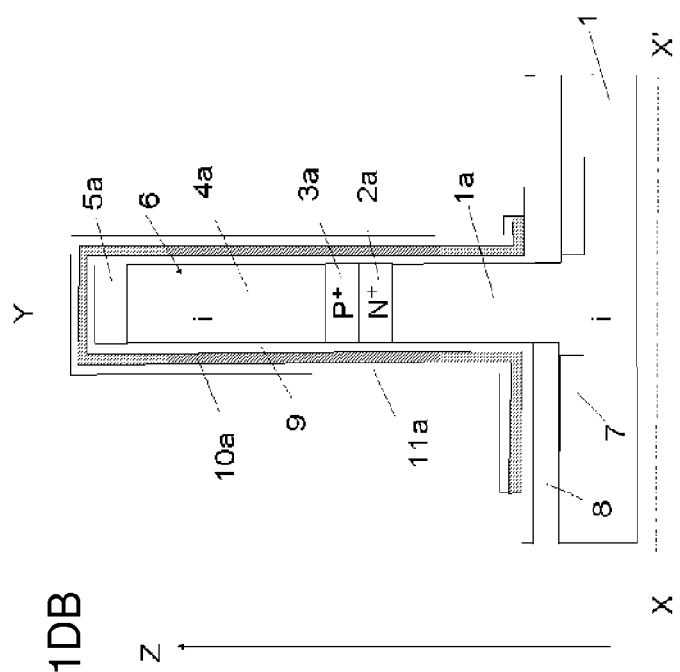

A method for manufacturing an SGT-including pillar-shaped semiconductor device according to an embodiment of the present invention will now be described with reference to the drawings.

First Embodiment

A method for manufacturing an SGT-including CMOS inverter circuit according to a first embodiment of the present invention is described below with reference to FIGS. 1A to 1L.

FIG. 1A includes a plan view and cross-sectional views illustrating a first step of the SGT-including CMOS inverter circuit. Part (a) is a plan view, part (b) is a cross-sectional view taken along line X-X' in (a), and part (c) is a cross-sectional view taken along line Y-Y' in (a). The relationship between the diagrams in part (a), part (b), and part (c) is the same for other drawings referred in the description below.

As illustrated in FIG. 1A, an $N^+$ region 2 containing a donor impurity such as arsenic (As) is formed on an i-layer substrate 1 by an ion implantation method or an epitaxial growth method. Next, a $P^+$ region 3 containing an acceptor impurity such as boron (B) is formed on the $N^+$ region 2 by an ion implantation method or an epitaxial growth method. An i-region 4 is formed on the $P^+$ region 3 by an epitaxial growth method. Then a $SiO_2$ layer 5 is formed on the i-region 4 by a thermal oxidation method.

Next, as illustrated in FIG. 1B, the $SiO_2$ layer 5 is etched by performing a lithography method and a reactive ion etching (RIE) method so as to form a $SiO_2$ layer 5a. The i-region 4, the $P^+$ region 3, the $N^+$ region 2, and the i-layer substrate 1 are then etched by a RIE method using the $SiO_2$ layer 5a as a mask so as to form a Si pillar 6 that includes an i-region 4a, a $P^+$ region 3a, a $N^+$ region 2a, and an i-layer substrate 1a. The cross-sectional shape of the Si pillar 6 is preferably round as illustrated in FIG. 1B(a). The side surface of the Si pillar 6 preferably forms a substantially right angle with the upper surface of the i-layer substrate 1.

Next, as illustrated in FIG. 1C, an $N^+$ region 7 is formed in the upper surface layer of the i-layer substrate 1 at the outer periphery of the Si pillar 6 by an ion implantation method. Then a $SiO_2$ film is deposited by a chemical vapor deposition (CVD) method, the upper surface of the $SiO_2$ film is planarized by a mechanical chemical polishing (MCP) method, and the $SiO_2$ film is etched by an etch back method so as to have a $SiO_2$ layer 8 remain on the i-layer substrate 1 at the outer periphery of the Si pillar 6. Subsequently, an atomic layer deposition (ALD) method is employed to coat the entire Si pillar 6 and $SiO_2$ layer 8 with a hafnium oxide ($HfO_2$) layer 9 and a titanium nitride (TiN) layer 10. Then the Si pillar 6 and the entire peripheral area of the Si pillar 6 are coated with a $SiO_2$ layer 11 by a CVD method.

Next, as illustrated in FIG. 1D, the $SiO_2$ layer 11 and the TiN layer 10 are etched by a RIE method using a mask formed of a resist formed by a lithography method so as to form a $SiO_2$ layer 11a and a TiN layer 10a from the upper surface of the Si pillar 6 to the upper surface of the $SiO_2$ layer 8.

Figure 1E:
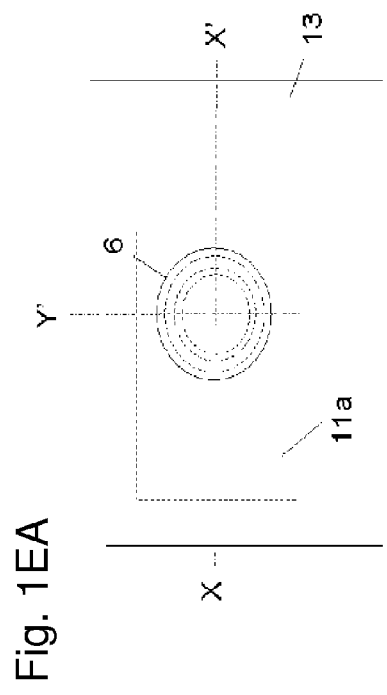
FIG. 1EA is a plan view, FIG. 1EB and FIG. 1EC are cross-sectional views of the CMOS inverter circuit for explaining the method for manufacturing an SGT-including semiconductor device according to the first embodiment.
Figure 1E:
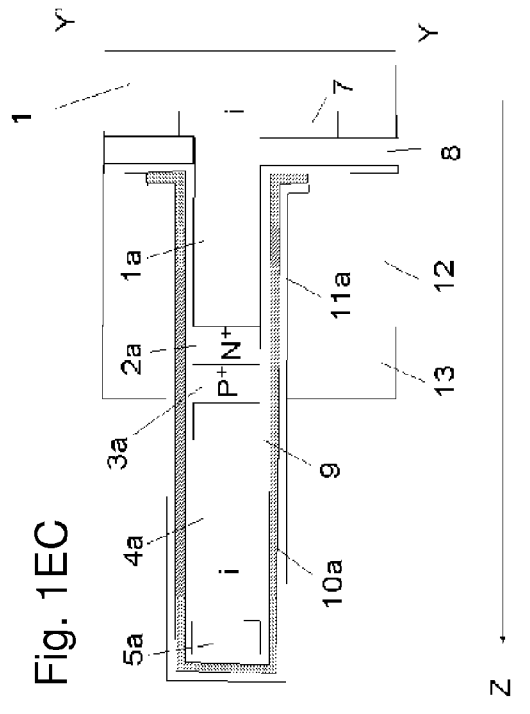
Figure 1E:
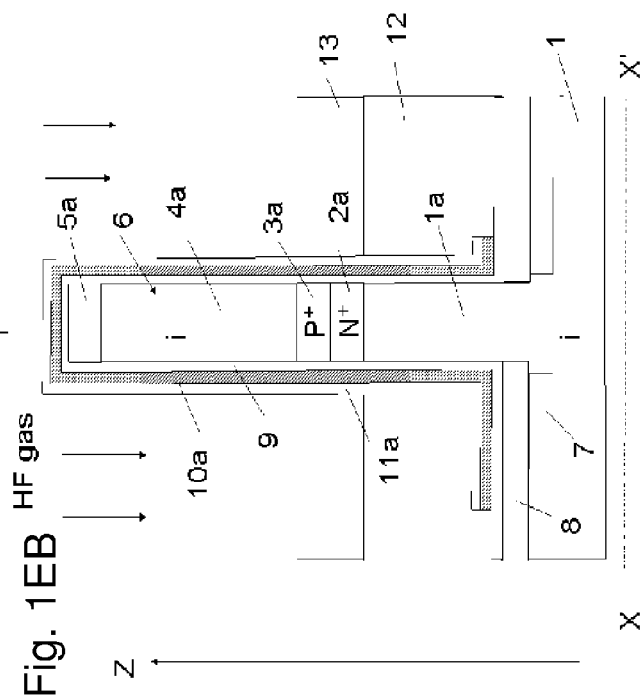

Next, as illustrated in FIG. 1E, a silicon nitride (SiN) layer 12 is formed at the outer periphery of the Si pillar 6. The SiN layer 12 is formed so that the position of its upper surface is at the same height as the lower end of the $N^+$ region 2a formed in the Si pillar 6. Then a resist layer 13 is formed on the SiN layer 12. Here, the resist layer 13 is formed so that the position of the upper surface is at the same height as the upper end of the $P^+$ region 3a. The resist layer 13 is formed by applying a resist material over the entire upper surface of the i-layer substrate 1 and performing a heat treatment at 200° C., for example, so as to increase the flowability of the resist material and to allow the resist material to evenly collect on the SiN layer 12 on the outer side of the Si pillar 6. Then hydrogen fluoride gas (hereinafter referred to as "HF gas") is supplied to all parts. Subsequently, a heating environment of 180° C. is created so as to ionize the HF gas by the moisture contained in the resist layer 13. As a result, hydrogen fluoride ions (hereinafter referred to as "HF ions") ($HF_2^+$) are formed. The HF ions thermally diffuse into the resist layer 13 and etch the $SiO_2$ layer 11a in contact with the resist layer 13 (refer to NPL 2 for the mechanism of etching). In contrast, the $SiO_2$ layer 11a not in contact with the resist layer 13 remains substantially unetched. Then the resist layer 13 is removed.

Figure 1F:
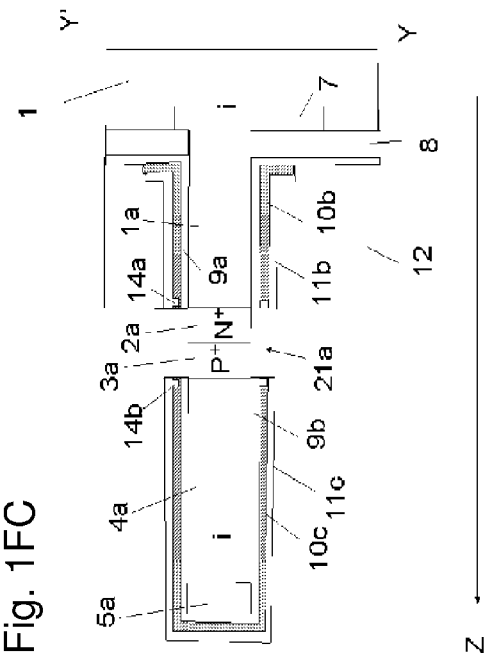
FIG. 1FA is a plan view, FIG. 1FB and FIG. 1FC are cross-sectional views of the CMOS inverter circuit for explaining the method for manufacturing an SGT-including semiconductor device according to the first embodiment.
Figure 1F:
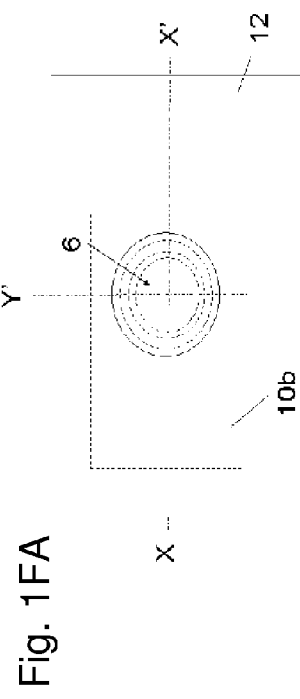
Figure 1F:
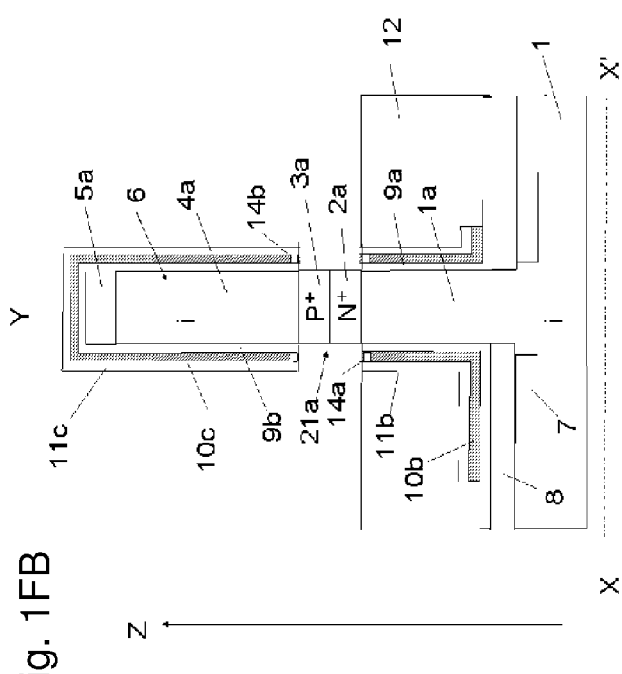

As a result, as illustrated in FIG. 1F, the $SiO_2$ layer 11a is divided into a $SiO_2$ layer 11b in a region covered with the SiN layer 12 and a $SiO_2$ layer 11c in an upper region of the Si pillar 6. Then the TiN layer 10a is etched by using the $SiO_2$ layers 11b and 11c as a mask. As a result, the TiN layer 10a is divided into a TiN layer 10b covered with the $SiO_2$ layer 11b in the lower region of the Si pillar 6 and a TiN layer 10c covered with the $SiO_2$ layer 11c in the upper region of the Si pillar 6. Then the $HfO_2$ layer 9 is etched by using the $SiO_2$ layers 11b and 11c and the TiN layers 10b and 10c as a mask so as to divide the $HfO_2$ layer 9 into a $HfO_2$ layer 9a partly covered with the TiN layer 10b in the lower region of the Si pillar 6 and a $HfO_2$ layer 9b covered with the TiN layer 10c in the upper region of the Si pillar 6. Then exposed portions of the TiN layers 10b and 10c are oxidized to form TiO (titanium oxide) layers 14a and 14b.

Next, as illustrated in FIG. 1G, for example, a substrate metal plate on which the i-layer substrate 1 is placed and a counter metal plate distant from the substrate metal plate are prepared, a DC voltage is applied to the substrate metal plate, and radiofrequency (RF) voltage is applied between these two parallel metal plates so as to sputter atoms of the material of the counter metal plate and deposit the atoms on the i-layer substrate 1. This process is a bias sputtering method. The bias sputtering method is performed so as to inject Si atoms in a direction perpendicular to the upper surface of the i-layer substrate 1 and to form a Si layer 15a on the SiN layer 12 and a Si layer 15b on the Si pillar 6. Here, the Si layer 15a is positioned so that the upper surface thereof is positioned near the upper end of an opening 21a. Then Ni atoms are injected in a direction perpendicular to the upper surface of the i-layer substrate 1 so as to deposit a Ni layer 16a on the Si layer 15a and a Ni layer 16b on the Si layer 15b. Since the Si and Ni atoms are injected in a direction perpendicular to the upper surface of the i-layer substrate 1, a space 17 having a width (depth) in a horizontal direction equal to the total thickness of the $SiO_2$ layer 11b, the TiN layer 10b, and the $HfO_2$ layer 9a or the total thickness of the $SiO_2$ layer 11c, the TiN layer 10c, and the $HfO_2$ layer 9b is formed in the opening 21a between the outer periphery of the $N^+$ region 2a and the $P^+$ region 3a and the Si layer 15. In forming the Si layers 15a and 15b and the Ni layers 16a and 16b, the angle between the side surface of the Si pillar 6 and the upper surface of the i-layer substrate 1 is a substantially right angle and thus the Si layer 15 and the Ni layer 16 can be formed only on the SiN layer 12 by controlling the bias voltage applied between the counter metal plate of the bias sputtering system and the substrate metal plate on which the i-layer substrate 1 is placed (refer to NPL 3 for the basic control method). Then the Si layer 15b and the Ni layer 16b on the Si pillar 6 are removed.

Figure 1H:
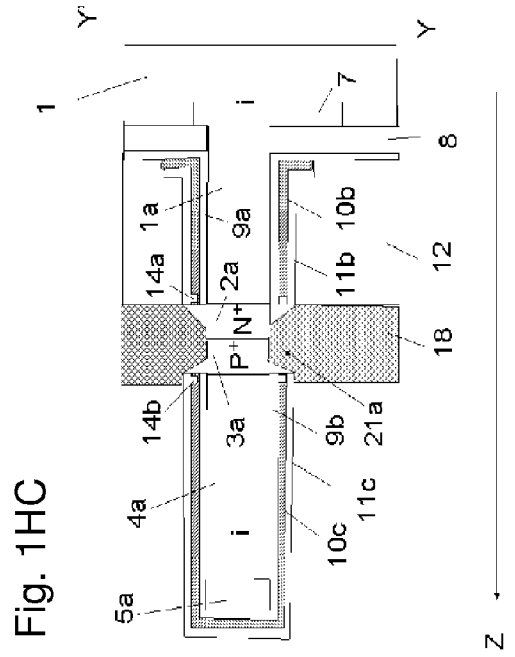
FIG. 1HA is a plan view, FIG. 1HB and FIG. 1HC are cross-sectional views of the CMOS inverter circuit for explaining the method for manufacturing an SGT-including semiconductor device according to the first embodiment.
Figure 1H:
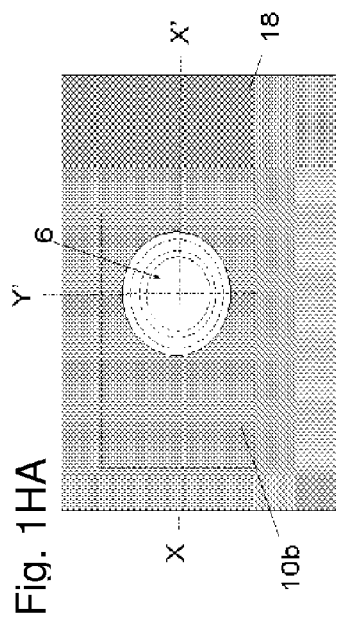
Figure 1H:
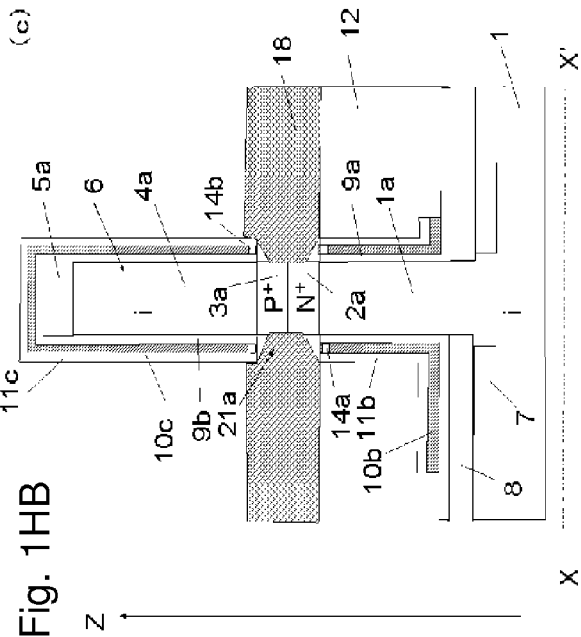

Next, as illustrated in FIG. 1H, a heat treatment is performed at, for example, 550° C. to diffuse the Ni atoms in the Ni layer 16a into the Si layer 15a so as to form a nickel silicide (NiSi) layer 18. The NiSi layer 18 expands and acquires a volume larger than that of the Si layer 15a. The expansion of the NiSi layer 18 occurs in the vertical (up-down) and horizontal (right-left) directions. Accordingly, the side surface of the NiSi layer 18 comes into contact with the side surfaces of the $N^+$ region 2a and the $P^+$ region 3a. Then the remaining Ni layer 16a is removed.

Figure 1I:
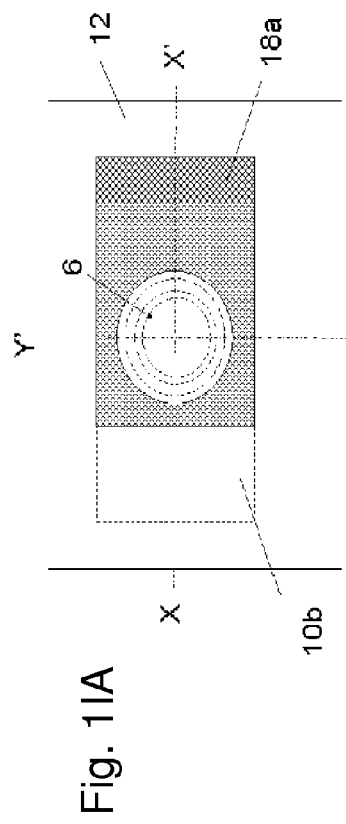
FIG. 1IA is a plan view, FIG. 1IB and FIG. 1IC are cross-sectional views of the CMOS inverter circuit for explaining the method for manufacturing an SGT-including semiconductor device according to the first embodiment.
Figure 1I:
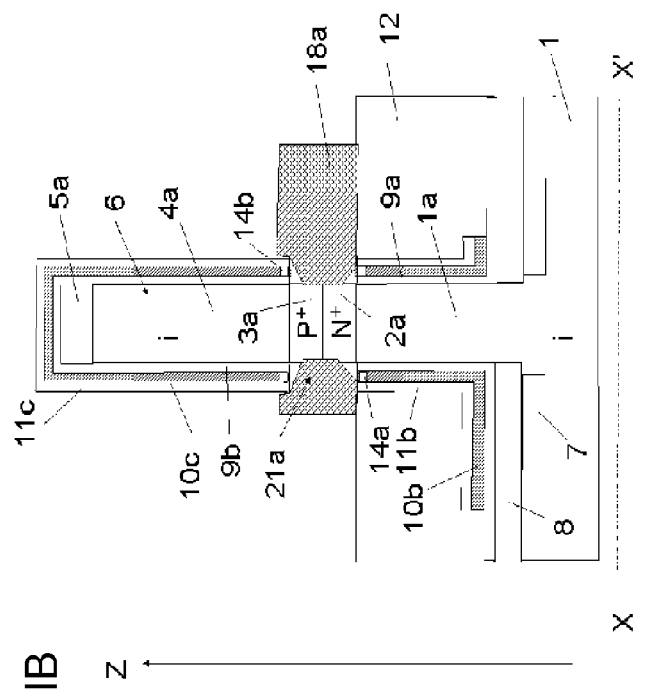
Figure 1I:
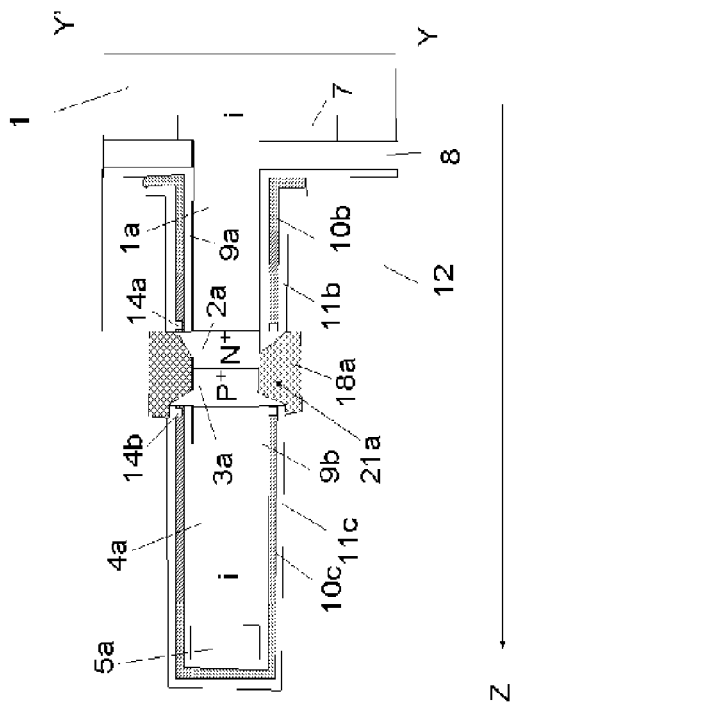

Next, as illustrated in FIG. 1I, the NiSi layer 18 is patterned by a lithography method and a RIE method so as to form a NiSi layer 18a.

Next, as illustrated in FIG. 1J, a SiN layer 20 is formed by the same method as that for forming the SiN layer 12 so that the upper surface thereof is positioned in the middle of the TiN layer 10c in the height direction. Then an opening 21b is formed at the outer periphery of the TiN layer 10c by the same method as that used for forming the opening 21a. Then a Si layer and a Ni layer are formed by injecting Si and Ni atoms in a direction perpendicular to the upper surface of the i-layer substrate 1 by the same method as that used for forming the Si layer 15a, for example, by a bias sputtering method. Then the Si layer is, for example, Ni-silicided by a heat treatment at 550° C., for example. After removing the remaining Ni layer, a NiSi layer 22 is formed by a lithography method and a RIE method. As a result, in the opening 21b, the TiN layer 10c comes into contact with the NiSi layer 22 in which the Si layer has expanded by Ni-silicidation.

Next, as illustrated in FIG. 1K, a $SiO_2$ layers 23 is formed over the entirety by a CVD method so that the upper surface thereof is positioned to be higher than the surface of the NiSi layer 22 and lower than the top portion of the Si pillar 6. Then the $SiO_2$ layer 11c, the TiN layer 10c, the $HfO_2$ layer 9b are etched by using the $SiO_2$ layer 23 as a mask so as to form a $SiO_2$ layer 11d, a TiN layer 10d, and a $HfO_2$ layer 9c. Next, a $P^+$ region 24 is formed in the top portion of the Si pillar 6 by a boron (B) ion implantation method by using the $SiO_2$ layers 23 and 11d, the TiN layer 10d, and the $HfO_2$ layer 9c as a mask.

Next, as illustrated in FIG. 1L, a $SiO_2$ layer 27 is formed over the entirety by a CVD method. Then a lithography method and a RIE method are employed to form a contact hole 28a on the TiN layer 10b so as to penetrate the NiSi layer 22, a contact hole 28b on the top portion of the Si pillar 6, a contact hole 28c on the NiSi layer 18a, and a contact hole 28d on an $N^+$ region 7a. Next, an input wiring metal layer Vin electrically connected to the NiSi layer 22 and the TiN layer 10b through the contact hole 28a is formed and a power supply wiring metal layer Vdd electrically connected to the $P^+$ region 24 in the top portion of the Si pillar 6 through the contact hole 28b is formed. An output wiring metal layer Vout electrically connected to the NiSi layer 18a through the contact hole 28c is formed and a ground wiring metal layer Vss electrically connected to an $N^+$ region 7a through the contact hole 28d is formed. A NiSi layer 29 is formed in the side surface layers of the $N^+$ region 2a and the $P^+$ region 3a in contact with the NiSi layer 18a.

As a result of performing the manufacturing method described above, a CMOS inverter circuit that includes an N-channel SGT and a P-channel SGT is formed, in which the N-channel SGT includes a channel which is the i-layer 1a in the lower portion of the Si pillar 6, a gate insulating layer which is the $HfO_2$ layer 9a surrounding the outer periphery of the i-layer 1a, a gate conductor layer which is the TiN layer 10b surrounding the outer periphery of the $HfO_2$ layer 9a, a source which is the $N^+$ region 7a below the i-layer 1a, and a drain which is the $N^+$ region 2a on the i-layer 1a and in which the P-channel SGT includes a channel which is the i-layer 4a in the upper portion of the Si pillar 6, a gate insulating layer which is the $HfO_2$ layer 9c surrounding the outer periphery of the i-layer 4a, a gate conductor layer which is the TiN layer 10d surrounding the outer periphery of the $HfO_2$ layer 9c, a source which is the $P^+$ region 3a below the i-region 4a, and a drain which is the $P^+$ region 24 on the i-layer 4a.

As illustrated in FIG. 1H, the NiSi layer 18 is connected to the $N^+$ region 2a and the $P^+$ region 3a by performing a heat treatment at, for example, 550° C. so as to diffuse the Ni atoms in the Ni layer 16a into the Si layer 15 to form a nickel silicide (NiSi) layer 18 and expand the NiSi layer 18 to be larger than the Si layer 15a. However, connecting the NiSi layer 18a to the $N^+$ region 2a and the $P^+$ region 3a need not be completed by a single treatment; it is sufficient if the NiSi layer 18a becomes connected to the N$^+$ region 2a and the P$^+$ region 3a by performing a heat treatment two or more times in the steps illustrated in FIGS. 1G to 1L so that the NiSi layer 18a is expanded before the last step of manufacturing the SGT. In this case, after the step illustrated in FIG. 1H, the remaining Ni layer 16 is preferably left unremoved.

The method for manufacturing a CMOS inverter circuit according to the first embodiment has the following effects.

A. According to a conventional method, an opening 21a is formed in a side surface of the Si pillar 6 and a Ni silicide layer having a thermal expansion coefficient different from that of the Si pillar 6 is directly formed inside the Si pillar 6 from the side surfaces of the N$^+$ region 2a and the P$^+$ region 3a in the opening 21a. According to this conventional method, bending and collapsing of the Si pillar 6 readily occur due to the thermal stress-induced strains occurring between the Si pillar and the Ni silicide layer having different thermal expansion coefficients. In contrast, according to the first embodiment, the Si layer 15a and the Ni layer 16a are formed by injecting the Si and Ni atoms in a direction perpendicular to the upper surface of the i-layer substrate 1. As a result, a space 17 is formed between the Si layer 15a, and the N$^+$ region 2a and the P$^+$ region 3a. When a heat treatment is performed subsequently to Ni-silicide the Si layer 15a to form a NiSi layer 18, the NiSi layer 18 expands and connects to the N$^+$ region 2a and the P$^+$ region 3a in the space 17. As a result, the Si layer 15a or the NiSi layers 18 and 18a surrounding the Si pillar 6 prevent bending and collapsing of the Si pillar 6. Moreover, since the NiSi layer is not directly formed on the N$^+$ region 2a and the P$^+$ region 3a, bending and collapsing of the Si pillar 6 are prevented.

B. Since the Si layer 15a and the Ni layer 16a are formed by injecting the Si and Ni atoms in a direction perpendicular to the upper surface of the i-layer substrate 1, the Si and Ni atoms are not deposited on the side surface of the SiO$_2$ layer 11c at the outer periphery of the Si pillar 6. Accordingly, there is no need to perform a step of removing a Si layer and a Ni layer deposited on the side surface of the SiO$_2$ layer 11c. As a result, the method for manufacturing a CMOS inverter circuit can be simplified.

Second Embodiment

A method for manufacturing an SGT-including CMOS inverter circuit according to a second embodiment of the present invention will now be described with reference to FIGS. 2A and 2B. A CMOS inverter circuit of the second embodiment is manufactured by the same steps as those illustrated in FIGS. 1A to 1L in the first embodiment except for the following structural differences.

Instead of the step of forming the Si layers 15a and 15b and the Ni layers 16a and 16b in FIG. 1G, a Si layer 30b, the following step illustrated in FIG. 2A is performed by, for example, a bias sputtering method: Si atoms are injected in a direction perpendicular to the upper surface of the i-layer substrate 1 so as to form a Si layer 30a on the SiN layer 12 and a Si layer 30c on the Si pillar 6, Ni atoms are then injected in a direction perpendicular to the upper surface of the i-layer substrate 1 so as to form a Ni layer 31a on the Si layer 30a and a Ni layer 31b on the Si layer 30c, and then Si atoms are injected in a direction perpendicular to the upper surface of the i-layer substrate 1 so as to form a Si layer 30b on the Ni layer 31a and a Si layer 30d on the Ni layer 31b. When the Si and Ni atoms are injected in a direction perpendicular to the upper surface of the i-layer substrate 1 as such to form the Si layer 30a, the Ni layer 31a, and the Si layer 30b, a space 17a similar to the space 17 in FIG. 1G is formed between the N$^+$ region 2a and the P$^+$ region 3a and the Si layer 30a, the Ni layer 31a, and the Si layer 30b. No Si layer or Ni layer is deposited on the side surface of the Si pillar 6. Then the Si layer 30c, the Ni layer 31b, and the Si layer 30d on the Si pillar 6 are removed.

Next, as illustrated in FIG. 2B, a heat treatment at, for example, 550° C. is performed to diffuse the Ni atoms from the Ni layer 31a into the Si layers 30a and 30b so as to form a nickel silicide (NiSi) layer 32 by the method shown in FIG. 1H. Here, the NiSi layer 32 expands and acquires a volume larger than that of the Si layers 30a and 30b. This expansion of the NiSi layer 32 occurs in the vertical (up-down) and horizontal (right-left) directions and thus the side surface of the NiSi layer 32 comes into contact with the side surfaces of the N$^+$ region 2a and the P$^+$ region 3a. Volume of the Ni layer 31a decreases as the Ni atoms diffuse into the Si layers 30a and 30b. By adequately adjusting the thickness of the Ni layer 31a, the Si layers 30a and 30b above and below the Ni layer 31a expand and a homogeneous NiSi layer 32 free of voids is ultimately formed.

The method for manufacturing a CMOS inverter circuit according to the second embodiment has the following effects.

A. The NiSi layer 32 preferably makes contact with the N$^+$ region 2a and the P$^+$ region 3a uniformly in the height direction. In the first embodiment, since the Ni layer 16a is formed at a height near the upper surface of the P$^+$ region 3a and on the Si layer 15a, the degree of expansion of the NiSi layer 18 within the space 17 differs in the vertical directions. In contrast, in the second embodiment, the Si layers 30a and 30b having substantially the same thickness are formed above and below the Ni layer 31a formed at the height near the interface between the N$^+$ region 2a and the P$^+$ region 3a and thus the NiSi layer 32 formed from the Ni layer 31a by the subsequent heat treatment expands uniformly in the vertical direction of the Ni layer 31a and uniformly connects to the N$^+$ region 2a and the P$^+$ region 3a.

B. Since the Ni layer 31a is sandwiched between the Si layers 30a and 30b, the Ni layer 31a cannot be removed as with the Ni layer 16a in the first embodiment after Ni-silicidation. Thus, the Ni layer may remain inside the NiSi layer 32 after Ni-silicidation. Even if all of the Ni atoms in the Ni layer 31a are diffused into the Si layers 30a and 30b and consumed, the space where the Ni layer 31a had existed does not turn into a NiSi layer 32 and voids may be formed. When voids are formed and the NiSi layer 18a is processed, failures such as abnormal etching will occur due to voids and contamination inside the voids by a cleaning solution. To address this, the Ni layer 31a is designed to have a thickness that does not cause voids in the NiSi layer 32 at least after the Ni-silicidation step so as to prevent such failures.

Third Embodiment

An SGT-including CMOS inverter circuit according to a third embodiment of the present invention will now be described with reference to FIG. 3.

A method for manufacturing an SGT-including CMOS inverter circuit according to the third embodiment of the present invention is described below with reference to FIG. 3. The CMOS inverter circuit of the third embodiment is manufactured by the same steps as those illustrated in FIGS. 1A to 1L of the first embodiment except for the structural differences described below.

Instead of the step illustrated in FIG. 1G of forming the Si layers 15a and 15b and the Ni layers 16a and 16b, the following process is performed by, for example, a bias sputtering method as illustrated in FIG. 3: Ni atoms are injected in a direction perpendicular to the upper surface of the i-layer substrate 1 to form a Ni layer 19a on the SiN layer 12 and a Ni layer 19b on the Si pillar 6, then Si atoms are injected in a direction perpendicular to the upper surface of the i-layer substrate 1 to form a Si layer 15a on the Ni layer 19a and a Si layer 15b on the Ni layer 19b, and then Ni atoms are injected in a direction perpendicular to the upper surface of the i-layer substrate 1 to form an Ni layer 16a on the Ni layer 19a and a Ni layer 16b on the Si layer 15b. Because the Si and Ni atoms are injected in a direction perpendicular to the upper surface of the i-layer substrate 1 to form the Ni layer 19a, the Si layer 15a, and the Ni layer 16a, a space 17b similar to the space 17 in FIG. 1G is formed between the $N^+$ region 2a and the $P^+$ region 3a and the Ni layer 19a, the Si layer 15a, and the Ni layer 16a. No Si layer or Ni layer is deposited on a side surface of the Si pillar 6. Then the Ni layer 19b, the Si layer 15b, and the Ni layer 16b on the Si pillar 6 are removed. Then, for example, a heat treatment at 550° C. is performed so that the Ni silicide layer formed by Ni-silicidation of the Si layer 15a expands in the horizontal direction as illustrated in FIG. 2B so as to come into contact with side surfaces of the $N^+$ region 2a and the $P^+$ region 3a.

According to a CMOS inverter circuit of the third embodiment, the Ni layers 19a and 16a are formed above and below the Si layer 15a. Accordingly, when a heat treatment is performed subsequently as illustrated in FIG. 2B, expansion occurs evenly in upward and downward directions centering about the height near the interface between the $N^+$ region 2a and the $P^+$ region 3a, thereby establishing connection to the $N^+$ region 2a and the $P^+$ region 3a. Therefore, the third embodiment achieves the same effect as the second embodiment.

Fourth Embodiment

An SGT-including CMOS inverter circuit according to a fourth embodiment of the present invention is described below with reference to FIGS. 4A and 4B.

Figure 4A:
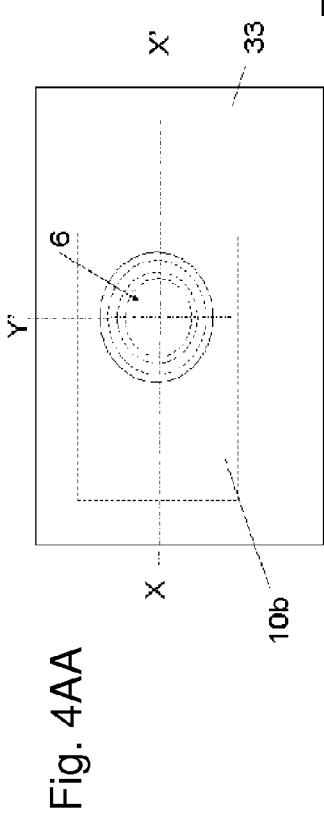
FIG. 4AA is a plan view, FIG. 4AB and FIG. 4AC are cross-sectional views of a CMOS inverter circuit for explaining a method for manufacturing an SGT-including semiconductor device according to a fourth embodiment of the present invention.
Figure 4A:
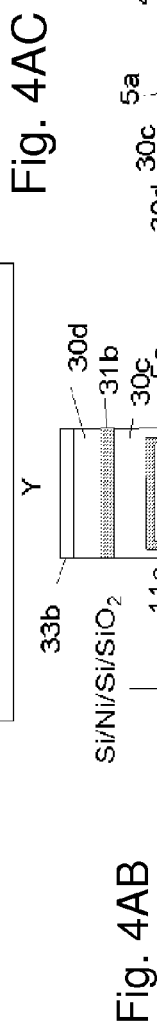
Figure 4A:
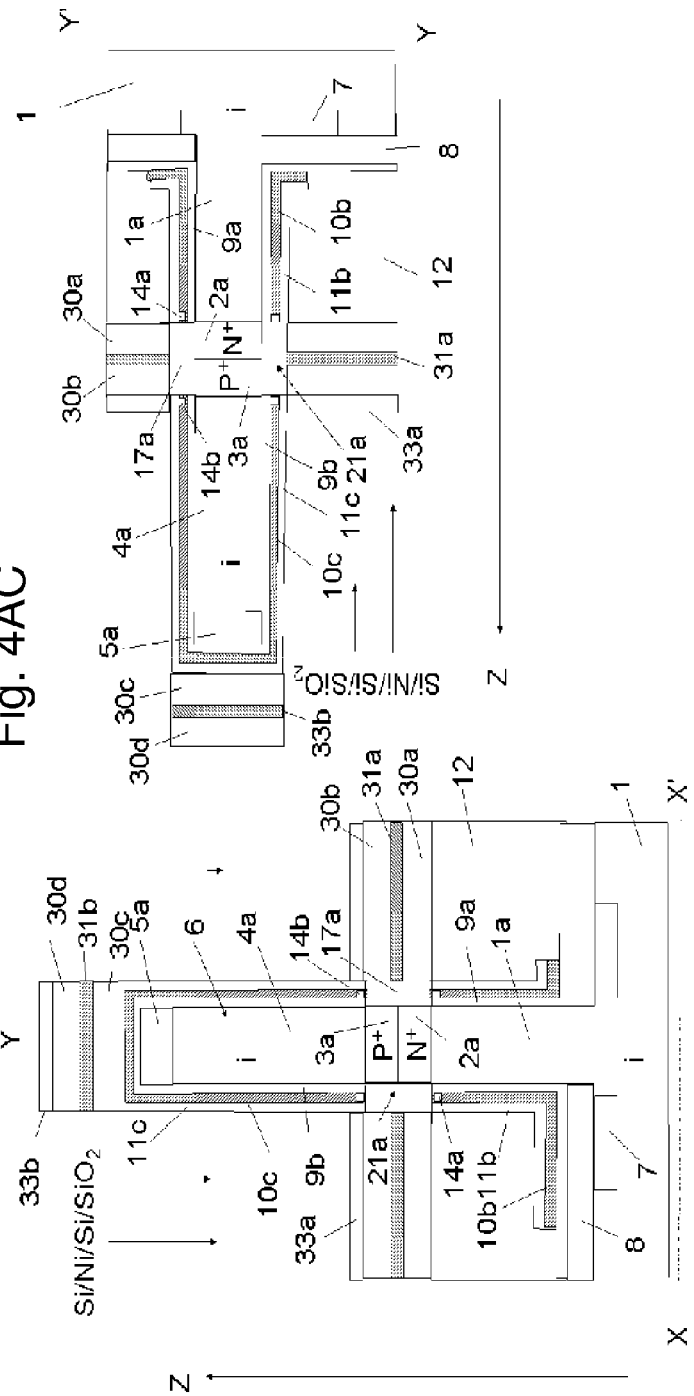

As illustrated in FIG. 4A, a Si layer 30a, a Ni layer 31a, and a Si layer 30b are formed on the SiN layer 12 by a bias sputtering method as illustrated in FIG. 2A while a Si layer 30c, a Ni layer 31b, and a Si layer 30d are formed on the Si pillar 6. Subsequently, a SiO$_2$ layer 33a is formed on the Si layer 30a and a SiO$_2$ layer 33b is formed on the Si layer 30d by a bias sputtering method. Then the Si layer 30c, the Ni layer 31b, the Si layer 30d, and the SiO$_2$ layer 33b on the Si pillar 6 are removed.

Next, as illustrated in FIG. 4B, for example, a heat treatment at 550° C. is conducted by the method illustrated in FIG. 2B so as to diffuse the Ni atoms in the Ni layer 31a into the Si layers 30a and 30b so as to form a NiSi layer 32a. The NiSi layer 32a expands and acquires a larger volume than the Si layers 30a and 30b. The SiO$_2$ layer 33a on the NiSi layer 32a suppresses expansion of the NiSi layer 32a in the upward direction. Meanwhile, the SiN layer 12 below the NiSi layer 32a suppresses expansion of the NiSi layer 32a in the downward direction. The SiO$_2$ layer 33a and the SiN layer 12 above and below the NiSi layer 32a promote expansion of the NiSi layer 32a in the horizontal direction (capping effect) so that the side surface of the NiSi layer 32a securely comes into contact with the side surfaces of the $N^+$ region 2a and the $P^+$ region 3a.

According to the fourth embodiment, expansion of the NiSi layer 32a in the horizontal direction can be accelerated by the capping effect of the SiO$_2$ layer 33a compared to the method (methods described with reference to FIGS. 1H, 2B, and 3, for example) in which an Ni-silicidation is performed without depositing the SiO$_2$ layer 33a. Accordingly, because the HfO$_2$ layers 9a and 9b, TiN layers 10b and 10c, and SiO$_2$ layers 11b and 11c surrounding the outer periphery of the Si pillar 6 are thick, the connection between the NiSi layer 32a and the $N^+$ region 2a and the $P^+$ region 3a can be easily established even in a case where the $N^+$ region 2a and the $P^+$ region 3a are greatly distanced from the Si layer 30a, the Ni layer 31a, and the Si layer 30b in the space 17a.

Fifth Embodiment

An SGT-including CMOS inverter circuit according to a fifth embodiment of the present invention is described below with reference to FIGS. 5A to 5C.

As illustrated in FIG. 5A, Si and Ni atoms are injected in a direction perpendicular to the upper surface of the i-layer substrate 1 by, for example, a bias sputtering method illustrated in FIG. 2A so as to form a Si layer 30a, a Ni layer 31a, and a Si layer 30b on the SiN layer 12 while forming a Si layer 30c, a Ni layer 31b, and a Si layer 30d on the Si pillar 6. Then the Si layer 30c, the Ni layer 31b, and the Si layer 30d on the Si pillar 6 are removed. Then the Si layer 30a, the Ni layer 31a, and the Si layer 30b are etched by a lithography method and a RIE method so as to form a Si layer 30aa, a Ni layer 31aa, and a Si layer 30bb. Here, the shapes of the Si layer 30aa, the Ni layer 31aa, and the Si layer 30bb in plan view are the same as those illustrated in FIG. 1I. A space 17a illustrated in FIG. 2A is formed between the $N^+$ region 2a and the $P^+$ region 3a and the Si layer 30aa, the Ni layer 31aa, and the Si layer 30aa.

Next, as illustrated in FIG. 5B, a SiO$_2$ layer 35 is deposited so as to cover the entirety by, for example, a CVD method.

Figure 5C:
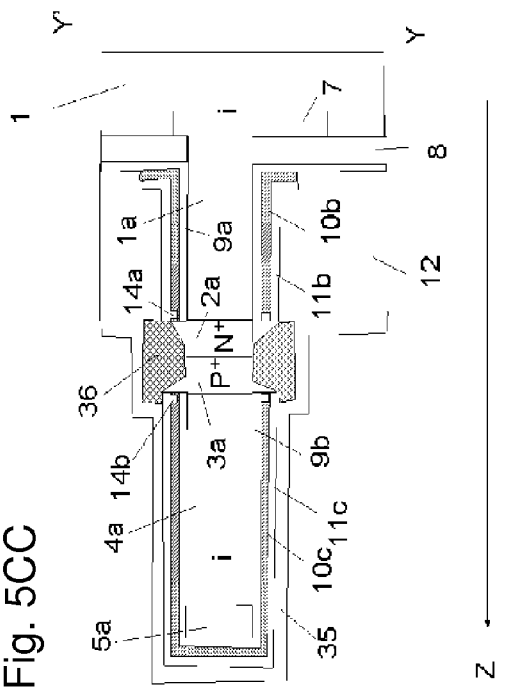
FIG. 5CA is a plan view, FIG. 5CB and FIG. 5CC are cross-sectional views of the CMOS inverter circuit for explaining the method for manufacturing an SGT-including semiconductor device according to the fifth embodiment.
Figure 5C:
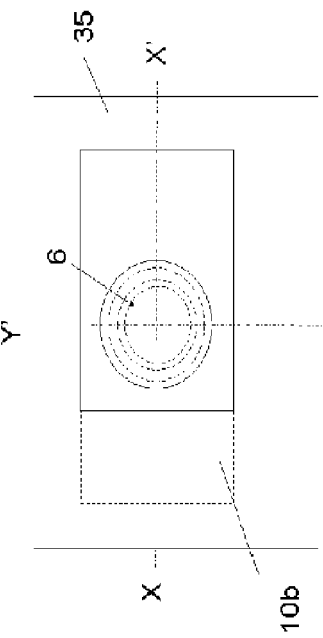
Figure 5C:
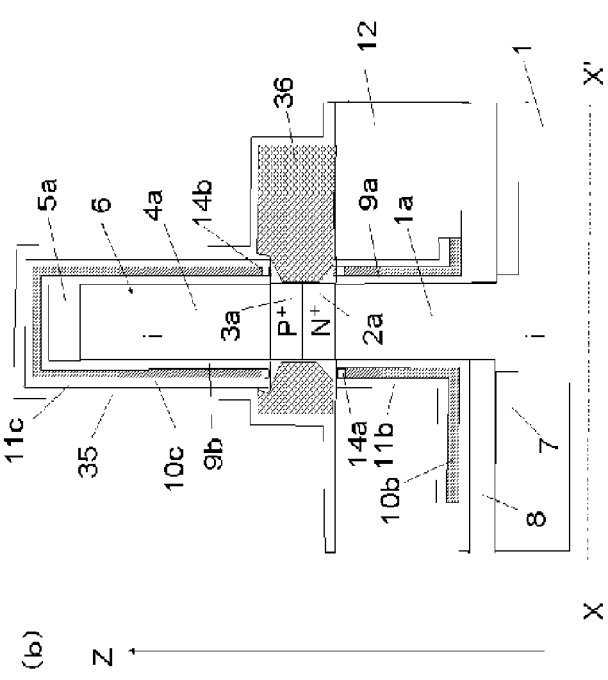

Next, as illustrated in FIG. 5C, a heat treatment at, for example, 550° C. is performed so as to diffuse the Ni atoms in the Ni layer 31aa into the Si layers 30aa and 30bb so as to form a NiSi layer 36. The NiSi layer 36 expands to have a volume larger than the Si layers 30aa and 30bb and comes into contact with the side surfaces of the $N^+$ region 2a and the $P^+$ region 3a.

According to the fifth embodiment, since the SiO$_2$ layer 35 is formed so as to cover the upper surface and the side surface of the NiSi layer 36, expansion of the NiSi layer 36 is suppressed in the regions contacting the SiO$_2$ layer 35 and the SiN layer 12. Consequently, expansion of the side surface of the NiSi layer 36 facing the side surfaces of the $N^+$ region 2a and the $P^+$ region 3a is accelerated. As a result, connection between the NiSi layer 36 and the $N^+$ region 2a and the $P^+$ region 3a can be easily established.

Sixth Embodiment

An SGT-including CMOS inverter circuit according to a sixth embodiment of the present invention is described below with reference to FIG. 6.

Figure 6A:
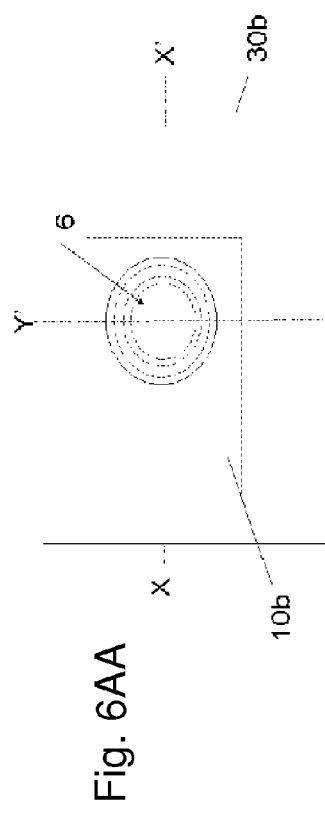
FIG. 6AA is a plan view, FIG. 6AB and FIG. 6AC are cross-sectional views of a CMOS inverter circuit for explaining a method for manufacturing an SGT-including semiconductor device according to a sixth embodiment of the present invention.
Figure 6A:
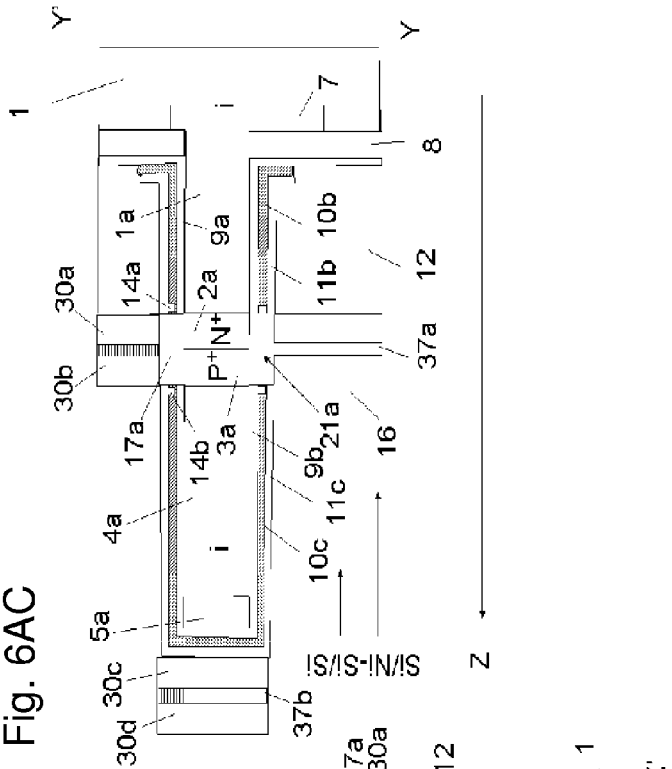
Figure 6A:
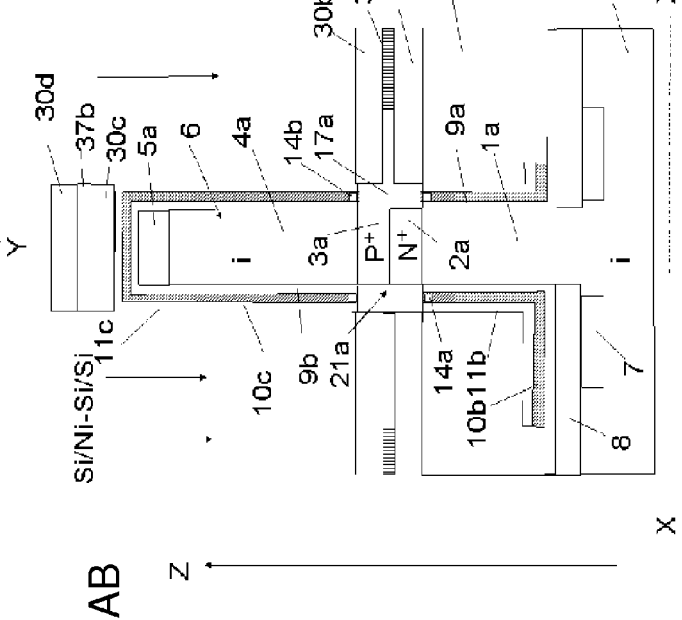

As illustrated in FIG. 6, Si atoms and Ni atoms are simultaneously injected in a direction perpendicular to the upper surface of the i-layer substrate 1 by, for example, a bias sputtering method so as to form, instead of the Ni layers 31a and 31b illustrated in FIG. 2A, Ni—Si layers (hereinafter, a mixed layer containing Ni atoms and Si atoms is referred to as a "Ni—Si layer") 37a and 37b on the SiN layer 12 and the Si pillar 6, in which the Ni atom concentration in the Ni—Si layers 37a and 37b is higher than the Si atom concentration in the Ni—Si layers 37a and 37b. Then the Si layer 30c, the Ni—Si layer 37b, and the Si layer 30d on the Si pillar 6 are removed. Subsequently, a heat treatment at, for example, 550° C. was performed so as to Ni-silicidize the Ni—Si layer 37a and diffuse excess Ni atoms in the Ni—Si layer 37a into the Si layers 30a and 30b so as to form a NiSi layer 32 as illustrated in FIG. 2B.

In the second embodiment referring to FIG. 2A, voids sometimes occur in the NiSi layer 32 in portions where the Ni layer 31a used to exist depending on the thickness, film quality, and silicidation conditions of the Ni layer 31a. In contrast, according to the sixth embodiment, the portion where the Ni—Si layer 37a used to exist is silicided first and thus occurrence of voids is prevented.

Seventh Embodiment

An SGT-including semiconductor device according to a seventh embodiment of the present invention is described below with reference to FIG. 7.

As illustrated in FIG. 7, prior to the last step of manufacturing an SGT-including semiconductor device, the NiSi layer 18a is in contact with the $N^+$ region 2a and the $P^+$ region 3a and Ni atoms from the NiSi layer 18a diffuse so as to form a NiSi layer 38 that lies in the $N^+$ region 2a and the $P^+$ region 3a and penetrates the Si pillar 6. The NiSi layer 38 is preferably formed at the outer periphery of the Si pillar 6 after forming the SiN layer 20 functioning as a material for preventing bending and collapsing of the Si pillar 6.

According to the first to sixth embodiments, the NiSi layers 18a, 32, 32a, and 36 are in contact with the outer peripheral side surfaces of the $N^+$ region 2a and the $P^+$ region 3a. When such a contact is established or when a heat treatment process is subsequently performed, a Ni silicide layer is formed in the surface layers of the $N^+$ region 2a and the $P^+$ region 3a. In contrast, according to the seventh embodiment, the NiSi layer 38 is formed so as to lie within the $N^+$ region 2a and the $P^+$ region 3a and penetrate the Si pillar 6. Since the NiSi layer 38 is formed so as to spread from the outer peripheral portions of the $N^+$ region 2a and the $P^+$ region 3a toward the center portion, the donor and acceptor impurities in the $N^+$ region 2a and the $P^+$ region 3a are swept out from the NiSi layer 38. As a result, the donor and acceptor impurity concentrations near the interfaces between the NiSi layer and the $N^+$ region 2a and the $P^+$ region 3a are increased. Consequently, the contact resistance between the NiSi layer 18a and the $N^+$ region 2a and the $P^+$ region 3a can be decreased.

Eighth Embodiment

An SGT-including semiconductor device according to an eighth embodiment of the present invention is described below with reference to FIGS. 8A and 8B.

Figure 8A:
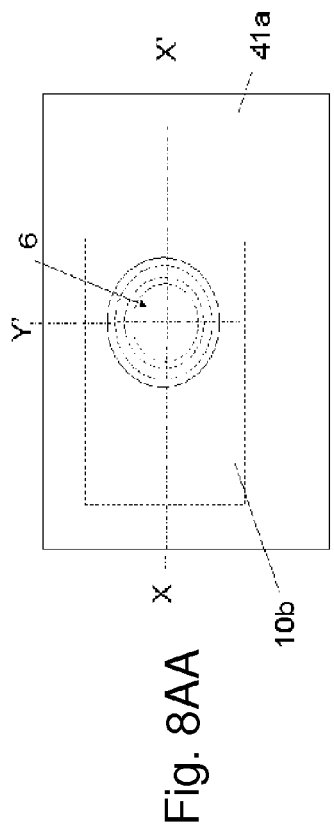
FIG. 8AA is a plan view, FIG. 8AB and FIG. 8AC are cross-sectional views of a CMOS inverter circuit for explaining a method for manufacturing an SGT-including semiconductor device according to an eighth embodiment of the present invention.
Figure 8A:
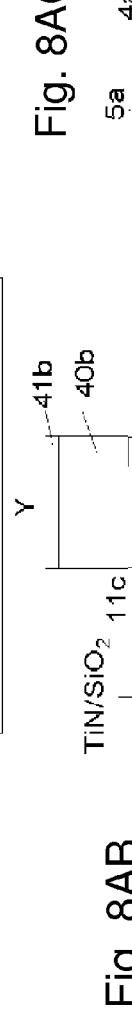
Figure 8A:
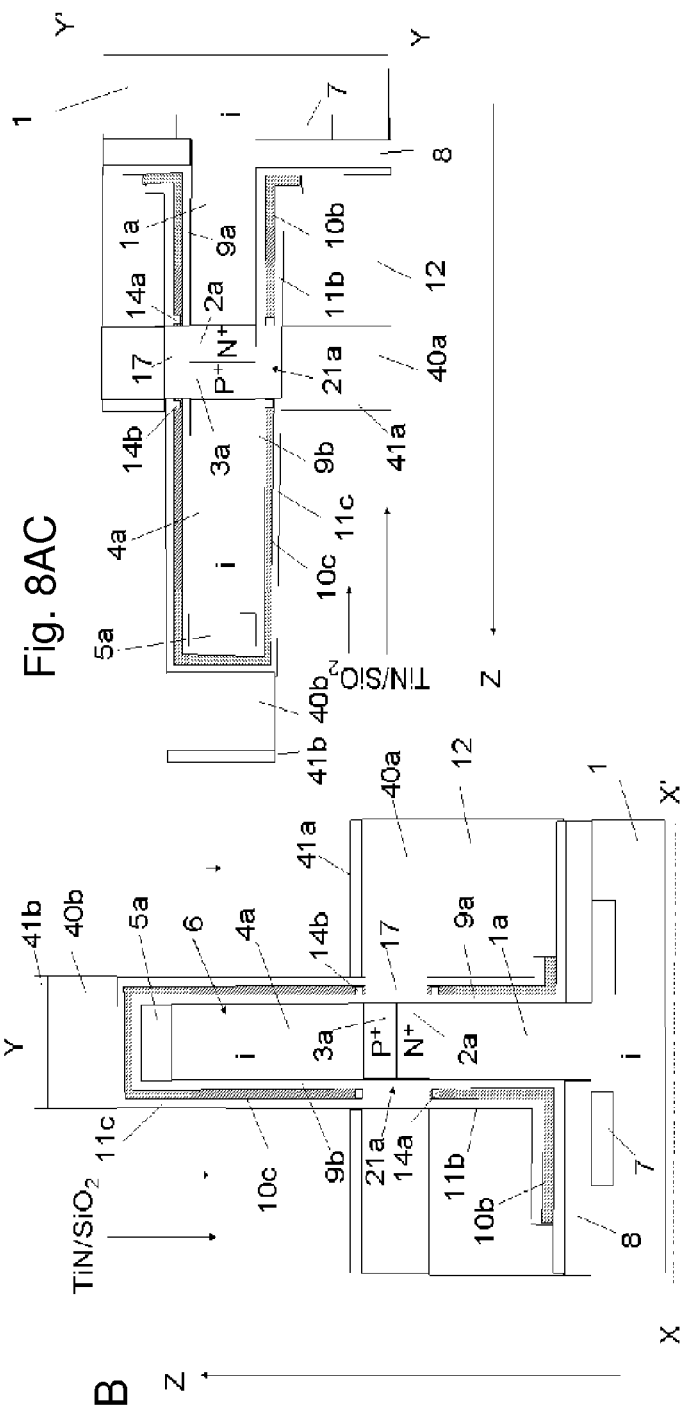

As illustrated in FIG. 8A, TiN layers 40a and 40b are formed instead of the Si layers 15a and 15b and $SiO_2$ layers 41a and 41b are formed instead of the Ni layers 16a and 16b by a bias sputtering method as illustrated in FIG. 1H. During this process, as in FIG. 1H, a space 17 is formed between the $N^+$ region 2a and the $P^+$ region 3a and the TiN layer 40a and the $SiO_2$ layer 41a.

Next, as illustrated in FIG. 8B, the TiN layer 40b and the $SiO_2$ layer 41b are removed and then a heat treatment at, for example, 650° C. is performed. As a result of this heat treatment, the TiN layer 40a undergoes plastic deformation and expands in the horizontal direction and a TiN layer 40c after plastic deformation connects to the side surfaces of the $N^+$ region 2a and the $P^+$ region 3a. The TiN layer 40a is sandwiched between the SiN layer 12 and the $SiO_2$ layer 41a having different thermal expansion coefficients and thus stress-induced strain is increased. Accordingly, the TiN layer 40c easily undergoes plastic deformation during which deformation in the upward direction is suppressed and expansion of the TiN layer 40c in the horizontal direction is accelerated. Thus, the connection to the $N^+$ region 2a and the $P^+$ region 3a is easily established.

In the first embodiment, when the NiSi layer 18, which is a conductor layer, is being formed as a result of diffusion of Ni atoms from the Ni layer 16a into the Si layer 15a (Ni silicidation), the NiSi layer 18 expands in the horizontal direction and connects to the $N^+$ region 2a and the $P^+$ region 3a. In contrast, in the eighth embodiment, the TiN layer 40c undergoing plastic deformation by the heat treatment expands in the horizontal direction and connects to the $N^+$ region 2a and the $P^+$ region 3a as in the first embodiment. As a result, the eighth embodiment achieves the same effect as the first embodiment.

Ninth Embodiment

An SGT-including semiconductor device according to an eighth embodiment of the present invention is described below with reference to FIGS. 9A to 9D. A CMOS inverter circuit according to the ninth embodiment is manufactured by the same steps as those illustrated in FIGS. 1A to 1L in the first embodiment except for the following structural differences.

Figure 9A:
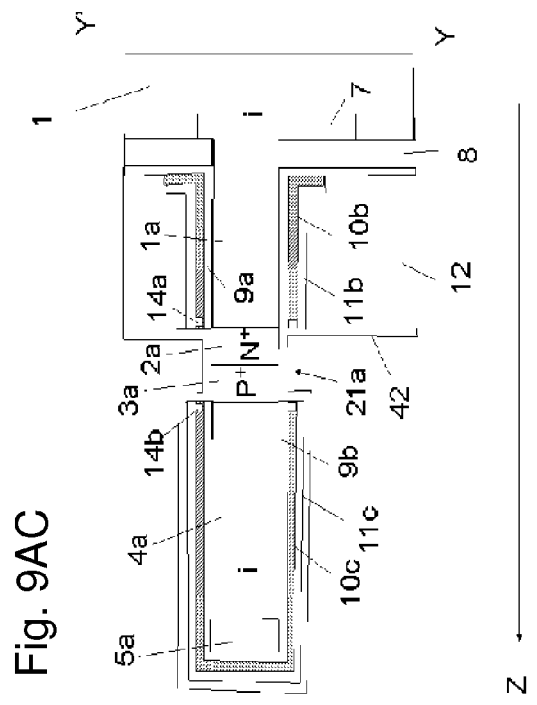
FIG. 9AA is a plan view, FIG. 9AB and FIG. 9AC are cross-sectional views of a CMOS inverter circuit for explaining a method for manufacturing an SGT-including semiconductor device according to a ninth embodiment of the present invention.
Figure 9A:
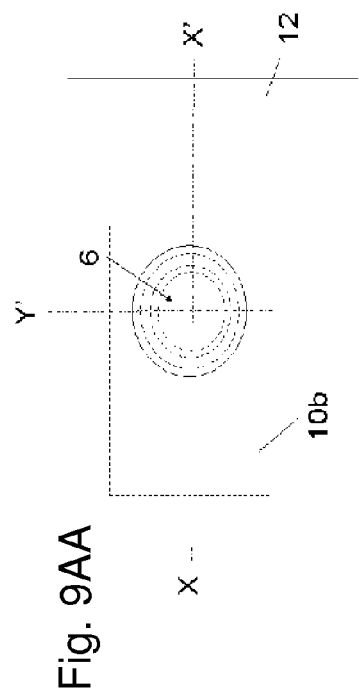
Figure 9A:
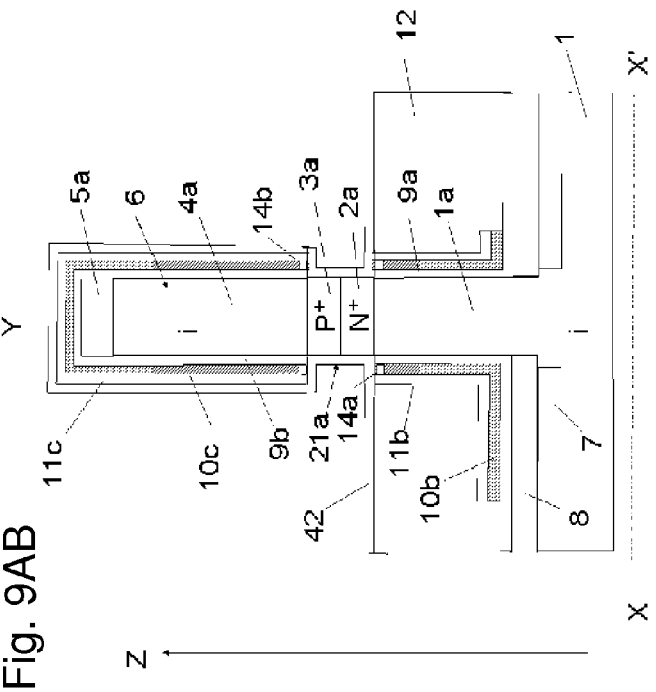

As illustrated in FIG. 9A, after the step of FIG. 1F, a poly Si layer 42 is formed to cover the entirety by, for example, a CVD method. As a result, a poly Si layer 42 that surrounds the outer peripheries of the $N^+$ region 2a and the $P^+$ region 3a is formed.

Figure 9B:
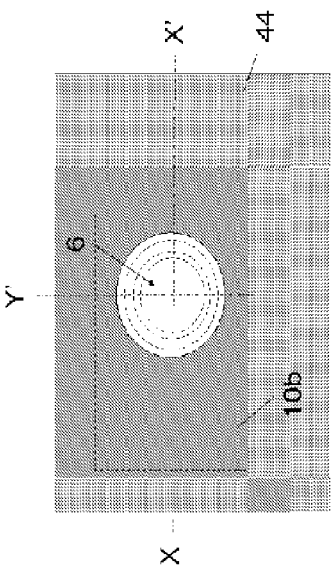
FIG. 9BA is a plan view, FIG. 9BB and FIG. 9BC are cross-sectional views of the CMOS inverter circuit for explaining the method for manufacturing an SGT-including semiconductor device according to the ninth embodiment.
Figure 9B:
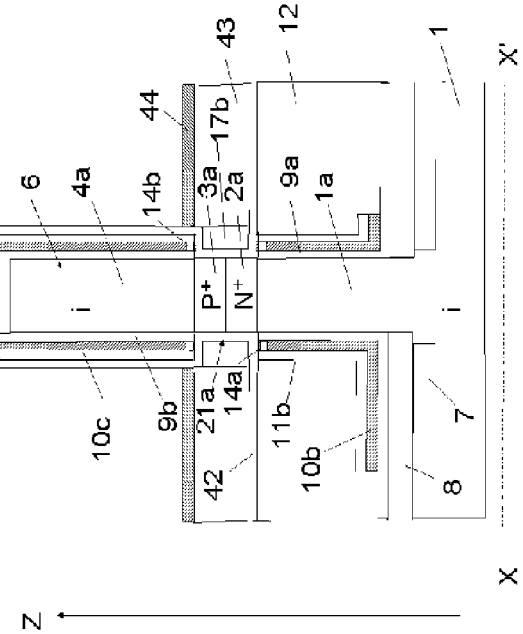
Figure 9B:
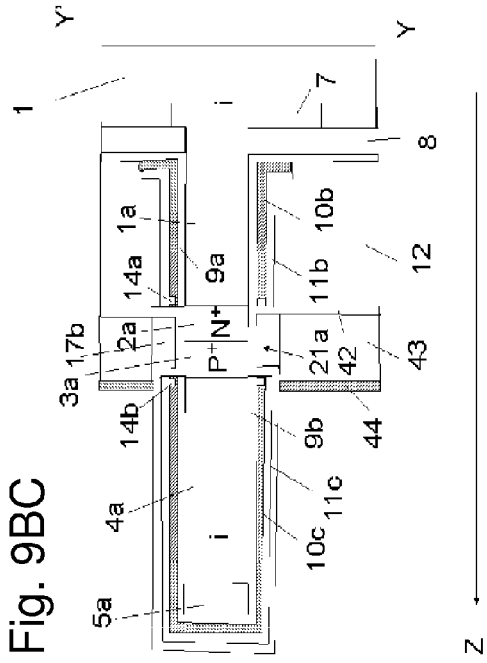
Figure 10:
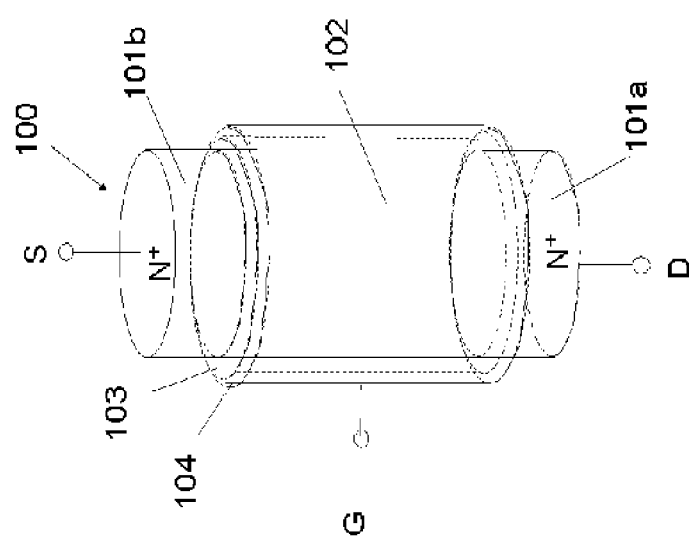
FIG. 10 is a schematic view of a conventional SGT.
Figure 11:
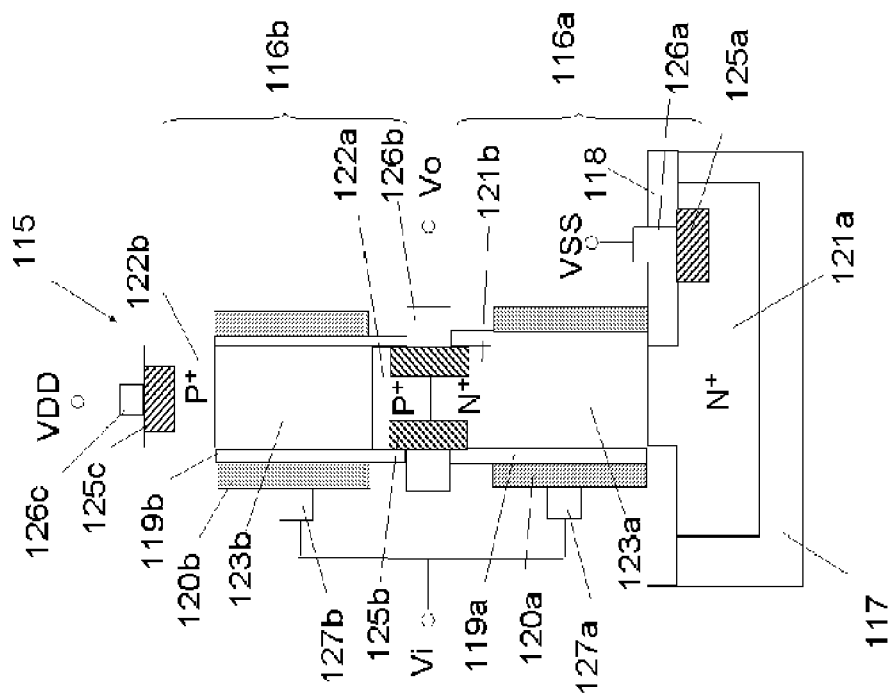
FIG. 11 is a schematic view of a CMOS inverter circuit in which an N-channel SGT is formed in a lower portion and a P-channel SGT is formed in an upper portion of one Si pillar according to a conventional example.

Next, as illustrated in FIG. 9B, Si and Ni atoms are injected in a direction perpendicular to the upper surface of the i-layer substrate 1 from above the Si pillar 6 so as to form a Si layer 43 and a Ni layer 44 on the SiN layer 12. During this process, a space 17b is formed between the Si layer 43 and the $N^+$ region 2a and the $P^+$ region 3a.

Next, as illustrated in FIG. 9C, the poly Si layer 42 in contact with the $SiO_2$ layer 11c surrounding the Si pillar 6 is removed by using the Ni layer 44 as a mask so as to form a poly Si layer 42a.

Next, as illustrated in FIG. 9D, a heat treatment at, for example, 550° C. is performed to diffuse the Ni atoms in the Ni layer 44 into a Si layer 43. During this process, the NiSi layer 45 expands in the horizontal direction due to Ni-silicidation of the NiSi layer 45 and comes into contact with the poly Si layer 42a formed on the side surfaces of the $N^+$ region 2a and the $P^+$ region 3a. In such a case, because of the diffusion of donor and acceptor impurities from the $N^+$ region 2a and the $P^+$ region 3a into the poly Si layer 42a and Ni silicidation of the poly Si layer 42a in contact with the NiSi layer 45, the NiSi layer 45 is electrically connected to the $N^+$ region 2a and the $P^+$ region 3a.

According to the ninth embodiment, the NiSi layer 45 does not make direct contact with the $N^+$ region 2a and the $P^+$ region 3a but with the poly Si layer 42a surrounding the $N^+$ region 2a and the $P^+$ region 3a. This poly Si layer 42a serves as a reinforcing material that prevents bending and collapsing of the Si pillar 6. The effect of preventing bending and collapsing of the Si pillar 6 is more effectively exhibited as the diameter of the Si pillar 6 decreases.

Note that in the first embodiment, Si and Ni atoms are injected in a direction perpendicular to the upper surface of the i-layer substrate 1 by a bias sputtering method so as to deposit the Si layers 15a and 15b and the Ni layers 16a and 16b on the SiN layer 12 and the top portion of the Si pillar 6.

The bias sputtering method used here involves applying radiofrequency voltage to the substrate electrode plate on which the i-layer substrate 1 is placed and a counter electrode plate distant from the i-layer substrate 1 while applying voltage to the substrate electrode plate so as to deposit Si atom ions, Ni atom ions, etc., over the i-layer substrate 1. Any method other than the bias sputtering method may be employed as long as the Si layer 15a and the Ni layer 16a can be formed by injecting Si and Ni atoms in a direction perpendicular to the upper surface of the i-layer substrate 1. Such a method can also be used to connect the TiN layer 10d to the NiSi layer 22. Moreover, this method is also applicable to other embodiments of the present invention.

In the first embodiment, the Si layer 15a and the Ni layer 16a are formed and subjected to a heat treatment so as to diffuse Ni atoms in the Ni layer 16a into the Si layer 15a, thereby silicidizing the Si layer 15a into the NiSi layer 18. During this process, the NiSi layer 18 expands and connects to the $N^+$ region 2a and the $P^+$ region 3a which had been distant. Any other metal layer, such as titanium (Ti) or cobalt (Co), may be used instead of the Ni layer 16a as long as metal atoms diffuse into the Si layer 15a and the Si layer 15a expands to form an alloy layer. This is also applicable to the connection between the TiN layer 10d and the NiSi layer 22. This is also applicable to other embodiments of the present invention.

In the first embodiment, the Si layer 15a and the Ni layer 16a are formed and subjected to a heat treatment so as to diffuse Ni atoms in the Ni layer 16a into the Si layer 15a, thereby silicidizing the Si layer 15a into the NiSi layer 18. During this process, the NiSi layer 18 expands and connects to the $N^+$ region 2a and the $P^+$ region 3a which had been distant. However, any other material layer can be used as long as material atoms can be injected in a direction perpendicular to the upper surface of the i-layer substrate 1 so as to form a material layer including one or more conductor layers (semiconductor layers or conductor layers) on the i-layer substrate 1 and the alloyed conductor material layers can expand in the horizontal direction by the subsequent heat treatment so as to connect to the side surfaces of the $N^+$ region 2a and the $P^+$ region 3a. This is also applicable to the connection between the TiN layer 10d and the NiSi layer 22. This is also applicable to other embodiments of the present invention.

In the first embodiment, a Si pillar 6 whose side surface forms a substantially right angle (about 90°) with the upper surface of the i-layer substrate 1 is formed, a Si layer 15a and a Ni layer 16a are formed on the SiN layer 12, and a Si layer 15b and a Ni layer 16b are formed on the top of the Si pillar 6. Because the angle formed between the side surface of the Si pillar 6 and the upper surface of the i-layer substrate 1 is a substantially right angle, deposition of Si and Ni atoms on the side surface of the $SiO_2$ layer 11c surrounding the outer periphery of the Si pillar 6 is prevented. This angle at the side surface of the Si pillar 6 can be less than 90° as long as Si and Ni atoms do not deposit on the side surface of the $SiO_2$ layer 11c surrounding the outer periphery of the Si pillar 6. For example, in a bias sputtering method, the bias voltage applied between the substrate electrode plate on which the i-layer substrate 1 is placed and the counter electrode plate distant from the i-layer substrate 1 is controlled so as to prevent deposition of Si and Ni atoms on the side surface of the $SiO_2$ layer 11c (refer to NPL 3 for the basic procedure). Deposition of Si and Ni atoms on the side surface of the $SiO_2$ layer 11c should not be a problem as long as the atoms can be easily etched away with a diluted hydrofluoric acid, for example. This is also applicable to the connection between the TiN layer 10d and the NiSi layer 22. This is also applicable to other embodiments of the present invention.

In the first embodiment, the connection between the NiSi layer 18 and the $N^+$ region 2a and the $P^+$ region 3a is established by a heat treatment in FIG. 1H. The connection between the NiSi layer 18 and the $N^+$ region 2a and the $P^+$ region 3a need only be established before the final step of manufacturing the SGT by expansion of the NiSi layer 18a. This is also applicable to the connection between the TiN layer 10d and the NiSi layer 22. This is also applicable to other embodiments of the present invention.

Referring to FIG. 1L related to the first embodiment, it has been described that the NiSi layer 29 is formed in the side surface layers of the $N^+$ region 2a and the $P^+$ region 3a so as to contact the NiSi layer 18a. The NiSi layer 29 is formed after the NiSi layer 29 has come into contact with the side surfaces of the $N^+$ region 2a and the $P^+$ region 3a as a result of diffusion of the Ni atoms into the $N^+$ region 2a and the $P^+$ region 3a through the heating process conducted before and in the step illustrated in FIG. 1L. NiSi layers similar to the NiSi layer 29 are formed in the side surface layers of the $N^+$ region 2a and the $P^+$ region 3a in contact with the NiSi layers 18a, 32, 32a, 36, and 45.

In FIG. 8B related to the eighth embodiment, a Ti atom-containing alloy layer is formed in the side surface layers of the $N^+$ region 2a and the $P^+$ region 3a in contact with the TiN layer 40c as a result of the subsequent heating process.

In the first embodiment, an SGT is a pillar-shaped semiconductor device in which the technical idea of the present invention is applied to the connection between the NiSi layer 18a and the $N^+$ region 2a and the $P^+$ region 3a and the connection between the TiN layer 10d and the NiSi layer 22. Alternatively, one of the connection form can be applied to a pillar-shaped semiconductor device. This is also applicable to other embodiments of the present invention.

In the second to eighth embodiments, the technical idea of the present invention is applied to the connection between the $N^+$ region 2a and the $P^+$ region 3a and the NiSi layers 18, 18a, 32, 32a, and 36 or the TiN layer 40a. However, the manufacturing methods of these embodiments is also applicable to the connection to the TiN layer 10d.

In the sixth embodiment, the Ni—Si layer 37a containing Ni and Si is used instead of the Ni layer 31a. This is also applicable to other embodiments of the present invention. This is also applicable to the connection to the TiN layer 10d.

In the eighth embodiment, the $SiO_2$ layer 41a is formed on the TiN layer 40a. Alternatively, as illustrated in FIG. 5B, the same effect can be obtained by performing patterning on the TiN layer 40a by a lithography method and a RIE method, coating the entirety with the $SiO_2$ layer 35 by a CVD method, and performing a heat treatment.

In the eighth embodiment, the case in which the TiN layer 40a is used is described. Alternatively, for example, the technical idea of the present invention can be applied to a metal layer such as Ta Ti, or Pt or an alloy layer as long as the layer can connect to the $N^+$ region 2a and the $P^+$ region 3a by undergoing plastic deformation by being heat-treated. This is also applicable to the connection to the NiSi layer 22.

In connecting the TiN layer 40c to the $N^+$ region 2a and the $P^+$ region 3a in the eighth embodiment, a Ti alloy layer may be formed in the side surface layers of the $N^+$ region 2a and the $P^+$ region 3a or a Ti alloy layer may be formed inside as illustrated in FIG. 7.

In the ninth embodiment, the poly Si layer 42 is formed so as to surround the side surfaces of the $N^+$ region 2a and the $P^+$ region 3a. Instead of the poly Si material, any other semiconductor material or metal-containing material can be used as long as the NiSi layer 45 can be electrically connected to the N+ region 2a and the P+ region 3a.

In the ninth embodiment, as in the first embodiment, the Ni layer 44 is formed on the Si layer 43. The technical idea of the present invention is also applicable to the conductor connecting method similar to those in the second to eighth embodiments.

In the embodiments described above, examples in which a silicon (Si) pillar is used as a semiconductor pillar have been described. However, the technical idea of the present invention is not limited to this and is applicable to an SGT-including semiconductor device that uses a semiconductor pillar composed of a semiconductor material other than silicon.

The embodiments described above relate to a method for manufacturing a semiconductor device in which two SGTs are formed in one Si pillar. However, the technical idea of the present invention is not limited to this and is applicable to a method for manufacturing an SGT-including semiconductor device in which one SGT or three or more SGTs are formed in one semiconductor pillar.

In the first embodiment, an N-channel SGT is formed in a lower portion of the Si pillar 6 and a P-channel SGT is formed in an upper portion of the Si pillar 6. The technical idea of the present invention is applicable to a circuit in which a P-channel SGT is formed in the lower portion and an N-channel SGT is formed in the upper portion. Moreover, the technical idea of the present invention is applicable to formation of a circuit that includes N-channel SGTs or P-channel SGTs in both the upper and lower portions. This is also applicable to other embodiments of the present invention.

The Si layer 15a in the first embodiment may be replaced by any of other material layers such as a SiGe material layer as long as the material layer expands in the horizontal direction by a heat treatment performed after formation of the initial material layer on the SiN layer 12 so that the material layer connects to the N+ region 2a and the P+ region 3a. This is also applicable to the connection between the TiN layer 10d and the NiSi layer 22. This is also applicable to other embodiments of the present invention.

The embodiments described above each include an SGT having a structure in which the gate $SiO_2$ layer (gate insulating layer) 9c is formed at the outer periphery of a semiconductor pillar such as the Si pillar 6 and a TiN layer (gate conductor layer) 10d is formed at the outer periphery of the gate $SiO_2$ layer 9c. However, the structure is not limited to this. Since a flash memory element that has a conductor layer electrically floating between the TiN layer 10d and the gate $SiO_2$ layer 9c or a charge storage layer such as a SiN layer, for example, is also a type of SGTs, the technical idea of the present invention can be applied to a method for manufacturing such a flash memory element.

In the embodiments described above, the technical idea of the present invention are applied to CMOS inverter circuits. However, the technical idea of the present invention is also applicable to other semiconductor devices such as circuits, devices, and elements.

In the first embodiment, the gate conductor layers are the TiN layers 10b and 10d. This is not limiting and the gate conductor layers may be composed of other metal materials. The gate conductor layers may have a multilayer structure including a metal layer and a poly Si layer, for example. The impurity regions such as N+ region 2a and the P+ region 3a may have different conductivity types as with the N+ region 2a and the P+ region 3a or may be constituted by impurity layers of the same conductivity type. When the impurity regions have the same conductivity type, two impurity layers form one impurity region of the same conductivity type as a whole. Similarly, when the impurity regions have different conductivity types the two impurity layers also form one impurity region as a whole. Such a structure is also applicable to other embodiments of the present invention.

In the embodiments described above, a SOI substrate can be used instead of the i-layer substrate 1.

In the first embodiment, the N+ region 2a and the P+ region 3a are in contact with each other. The technical idea of the present invention is applicable to the cases in which an insulating layer is formed between the N+ region 2a and the P+ region 3a. This is also applicable to other embodiments of the present invention.

The present invention is subject to various embodiments and modifications without departing from the spirit and scope of the present invention in a broad sense. The embodiments described above are illustrative examples of the present invention and do not limit the scope of the present invention. The embodiments and modifications can be freely combined. If needed, some of the structural features of the embodiments described above may be omitted but such an omission may still fall within the technical scope of the present invention.

According to a method for manufacturing a pillar-shape semiconductor device, a highly integrated semiconductor device is obtained.

The following is a summary list of reference numerals and the corresponding structure used in the above description of the invention: i-layer substrate
1a, 4, 4a i layer
2, 2a, 7, 7a N+ region
3, 3a, 24 P+ region
5, 5a, 8, 11, 11a, 11b, 11c, 11d, 23, 27, 33a, 33b, 35, 41a, 41b $SiO_2$ layer
6 Si pillar
9, 9a, 9b, 9c $H_fO_2$ layer
10, 10a, 10b, 10c, 10d, 40a, 40b, 40c TiN layer
12, 20 SiN layer
13 resist layer
14a, 14b TiO layer
15a, 15b, 30a, 30b, 30c, 30d, 30aa, 30bb, 43 Si layer
17, 17a, 17b space
18, 18a, 19a, 19b, 19c, 22, 23a, 23b, 23c, 29, 30a, 30b, 32a, 36, 38, 45 NiSi layer
21a, 21b opening
28a, 28b, 28c, 28d, 43a, 43b, 43c, 43d contact hole
31a, 31b, 31aa, 44 Ni layer
37a, 37b Ni—Si layer
42, 42a poly Si layer
Vin input wiring metal layer
Vdd power supply wiring metal layer
Vout output wiring metal layer
Vss ground wiring metal layer
V1, V2 wiring metal layer

The invention claimed is:

1. A method for manufacturing a pillar-shaped semiconductor device, the method comprising:
   a semiconductor pillar forming step of forming a semiconductor pillar on a semiconductor substrate;
   a first impurity region forming step of forming a first impurity region in the semiconductor pillar, the first impurity region containing a donor and/or acceptor impurity and including at least one impurity layer;
   a first insulating layer forming step of forming a first insulating layer so as to surround an outer periphery of the semiconductor pillar;
   a conductive layer forming step of forming a conductive layer so as to surround an outer periphery of the first insulating layer;

a second insulating layer forming step of forming a second insulating layer so as to surround an outer periphery of the conductive layer;

an interlayer insulating layer forming step including at least one selected from a third insulating layer forming step of forming a third insulating layer having an upper surface positioned near a lower end of the first impurity region and a fourth insulating layer forming step of forming a fourth insulating layer having an upper surface positioned at a side surface of the conductive layer in a middle position in a height direction;

a side surface contact portion forming step including at least one selected from an impurity region side surface contact portion forming step of forming an impurity region side surface contact portion by etching-away the first insulating layer, the conductive layer, and the second insulating layer in a portion positioned at an outer periphery of a side surface of the first impurity region above the upper surface of the third insulating layer and a conductive layer side surface contact portion forming step of forming a conductive layer side surface contact portion by etching-away the second insulating layer in a portion positioned at the outer periphery of the conductive layer above the upper surface of the fourth insulating layer;

a material layer depositing step including at least one selected from a step of forming a first material layer on the third insulating layer so that the impurity region side surface contact portion forms a space and an upper surface of the first material layer is positioned near an upper end portion of the impurity region side surface contact portion and a step of forming a second material layer on the fourth insulating layer so that the conductive layer side surface contact portion forms a space and an upper surface of the second material layer is positioned to be higher than an upper end of the conductive layer side surface contact portion, these steps being performed by injecting an atom group in a direction perpendicular to an upper surface of the semiconductor substrate from above the semiconductor pillar, the atom group containing atoms constituting at least a conductive material; and a heat treatment step of performing a heat treatment to change a shape of the first material layer or the second material layer, wherein the heat treatment step includes a material layer connecting step that includes at least one selected from a step of expanding the first material layer so as to connect to the side surface of the first impurity region and a step of expanding the second material layer so as to connect to the side surface of the conductive layer.

2. The method for manufacturing a pillar-shaped semiconductor device according to claim 1, further comprising:

a second impurity region forming step of forming a second impurity region in a lower portion and/or an upper portion of the semiconductor pillar, the second impurity region having the same conductivity type as each impurity layer constituting the first impurity region, wherein a surrounding gate MOS transistor (SGT) is formed in which when one of the first impurity region and the second impurity region serves as a source, the other serves as a drain, the first insulating layer serves as a gate insulating layer, and the conductive layer serves as a gate conductor layer.

3. The method for manufacturing a pillar-shaped semiconductor device according to claim 1, further comprising:

a fifth insulating layer forming step of forming, after forming at least one selected from the first material layer and the second material layer, a fifth insulating layer on the first material layer and the second material layer, wherein the heat treatment step is performed after the fifth insulating layer forming step.

4. The method for manufacturing a pillar-shaped semiconductor device according to claim 1, wherein at least one selected from the first material layer and the second material layer is composed of a semiconductor material, the method further comprises a first metal material layer forming step of forming a metal-containing first metal material layer so as to contact at least one selected from an upper surface and a lower surface of the first material layer or the second material layer composed of the semiconductor material, and in the heat treatment step, the heat treatment is performed to diffuse metal atoms from the first metal material layer into at least one selected from the first material layer and the second material layer so as to form a first alloy layer and the material layer connecting step is performed by expanding the first alloy layer.

5. The method for manufacturing a pillar-shaped semiconductor device according to claim 4, wherein in the material layer connecting step of connecting the first alloy layer to the side surface of the first impurity region by expanding the first alloy layer, a second alloy layer having the same composition as the first alloy layer is formed in a side surface layer of the first impurity region.

6. The method for manufacturing a pillar-shaped semiconductor device according to claim 4, wherein in the material layer connecting step of connecting the first alloy layer to the side surface of the first impurity region by expanding the first alloy layer, a third alloy layer having the same composition as the first alloy layer is formed so as to penetrate the first impurity region in a horizontal direction.

7. The method for manufacturing a pillar-shaped semiconductor device according to claim 1, further comprising:

a second metal material layer forming step of forming a second metal material layer by causing at least one selected from the first material layer and the second material layer to contain a metal, wherein, in the heat treatment step, the heat treatment is performed so as to plastically deform and expand the second metal material layer to carry out the material layer connecting step.

8. The method for manufacturing a pillar-shaped semiconductor device according to claim 7, wherein, in the material layer connecting step, a fourth alloy layer containing metal atoms contained in the second metal material layer is formed in a part of the first impurity region.

9. The method for manufacturing a pillar-shaped semiconductor device according to claim 1, further comprising:

a semiconductor material layer forming step of forming a semiconductor material layer so as to surround the outer periphery of the first impurity region at the impurity region side surface contact portion, wherein in the heat treatment step, the heat treatment is performed so as to connect the first material layer to a side surface of the semiconductor material layer by expanding the first material layer.

* * * * *